(12) United States Patent
Kwon et al.

(10) Patent No.: US 12,207,499 B2
(45) Date of Patent: Jan. 21, 2025

(54) PIXEL AND A DISPLAY DEVICE INCLUDING THE SAME

(71) Applicants: Samsung Display Co., Ltd., Yongin-Si (KR); IUCF-HYU (Industry-University Cooperation Foundation Hanyang University), Seoul (KR)

(72) Inventors: Oh-Kyong Kwon, Seoul (KR); Minjae Jeong, Hwaseong-si (KR); Kyunghoon Chung, Yongin-si (KR)

(73) Assignees: Samsung Display Co., Ltd., Gyeonggi-Do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 428 days.

(21) Appl. No.: 17/747,060

(22) Filed: May 18, 2022

(65) Prior Publication Data

US 2022/0415991 A1 Dec. 29, 2022

(30) Foreign Application Priority Data

Jun. 28, 2021 (KR) .......................... 10-2021-0084245

(51) Int. Cl.
*G09G 3/3266* (2016.01)
*G09G 3/3275* (2016.01)
(Continued)

(52) U.S. Cl.
CPC ....... *H10K 59/1216* (2023.02); *G09G 3/3266* (2013.01); *G09G 3/3275* (2013.01);
(Continued)

(58) Field of Classification Search
CPC ... G09G 3/3266; G09G 3/3275; G09G 3/3233
See application file for complete search history.

(56) References Cited

U.S. PATENT DOCUMENTS

| | | |
|---|---|---|
| 9,202,410 B2 | 12/2015 | Kim |
| 9,460,662 B2 | 10/2016 | Lee et al. |

(Continued)

FOREIGN PATENT DOCUMENTS

| | | |
|---|---|---|
| EP | 3246913 | 11/2017 |
| KR | 10-0560780 | 3/2006 |

(Continued)

OTHER PUBLICATIONS

S.M. Choi et al., "A Self-compensated Voltage Programming Pixel Structure for Active-Matrix Organic Light Emitting Diodes", IDW Tech. Digest, 535-538 (2003).

(Continued)

*Primary Examiner* — Kevin M Nguyen
(74) *Attorney, Agent, or Firm* — F. CHAU & ASSOCIATES, LLC

(57) ABSTRACT

A pixel including: a light emitting diode; a first capacitor connected between first and second nodes; a second capacitor connected between the second node and a third node; a first transistor including a first electrode connected to the second node, a second electrode connected to an anode of the light emitting diode, and a gate electrode connected to the first node; a second transistor including a first electrode connected to the third node, a second electrode connected to a reference voltage line, and a gate electrode connected to a first scan line; a third transistor including a first electrode electrically connected to the first node, a second electrode connected to the reference voltage line, and a gate electrode connected to a second scan line; and a fourth transistor including a first electrode connected to a data line, a second electrode connected to the third node, and a gate electrode connected to a third scan line.

24 Claims, 18 Drawing Sheets

(51) Int. Cl.
　　　*H10K 59/121*　　　(2023.01)
　　　*H10K 59/131*　　　(2023.01)
(52) U.S. Cl.
　　　CPC ....... *H10K 59/1213* (2023.02); *H10K 59/131*
　　　　　　　(2023.02); *G09G 2310/061* (2013.01)

(56) References Cited

U.S. PATENT DOCUMENTS

| | | |
|---|---|---|
| 10,908,758 B2 | 2/2021 | Rhe et al. |
| 2005/0017934 A1 | 1/2005 | Chung et al. |
| 2016/0148571 A1 | 5/2016 | Cho et al. |
| 2021/0049965 A1 | 2/2021 | Jeon et al. |
| 2021/0174743 A1* | 6/2021 | Chang .................. G09G 3/3233 |

FOREIGN PATENT DOCUMENTS

| | | |
|---|---|---|
| KR | 10-1984196 | 5/2019 |
| KR | 10-2019-0114458 | 10/2019 |
| KR | 10-2185361 | 12/2020 |
| KR | 10-2021-0019635 | 2/2021 |

OTHER PUBLICATIONS

C. Lin et al., "Pixel Circuit With Leakage Prevention Scheme for Low-Frame-Rate AMOLED Displays", in IEEE Journal of the Electron Devices Society, vol. 8, pp. 235-240, 2020.

N. Keum et al., "An AMOLED Pixel Circuit With a Compensating Scheme for Variations in Subthreshold Slope and Threshold Voltage of Driving TFTs", in IEEE Journal of Solid-State Circuits, vol. 55, pp. 3087-3096, 2020.

\* cited by examiner

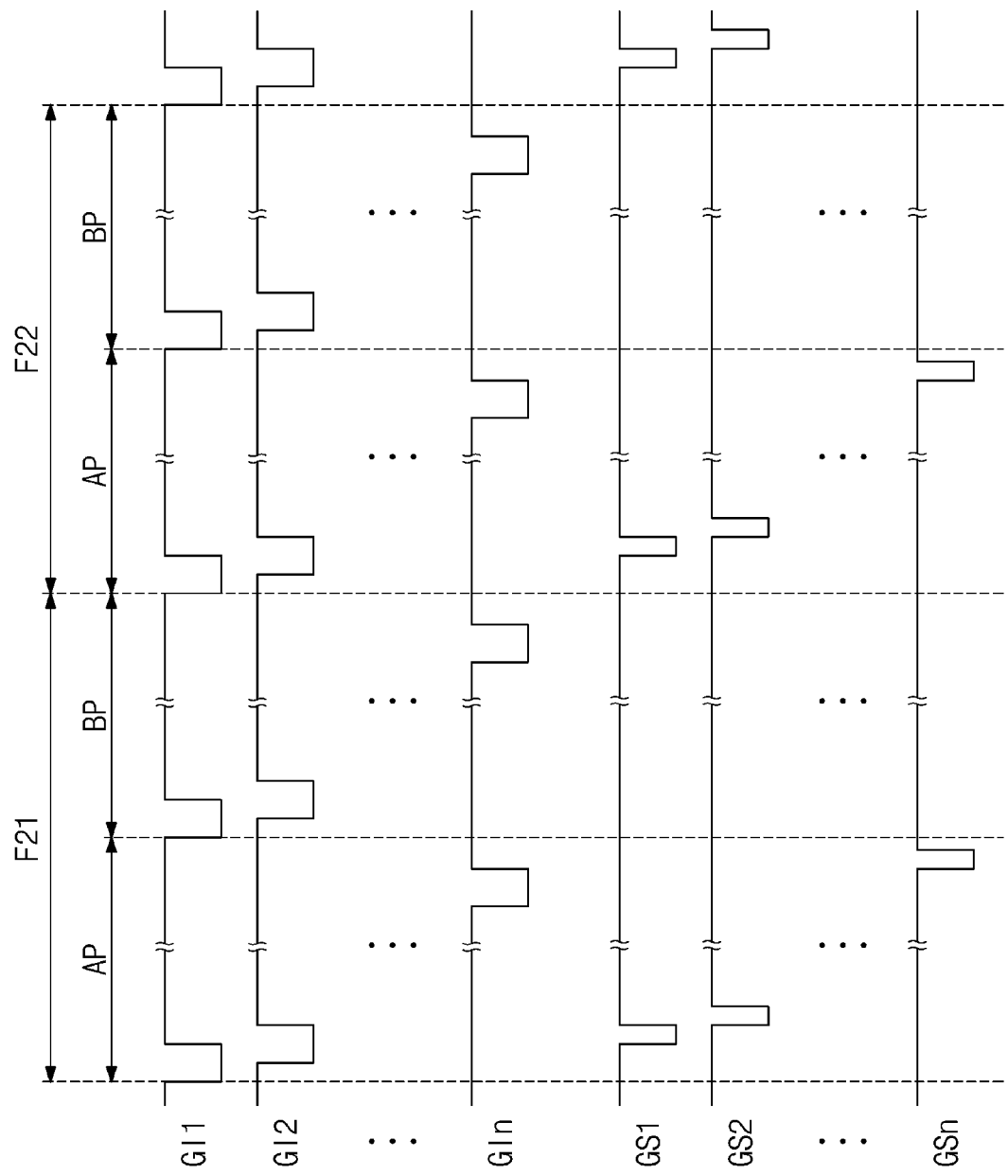

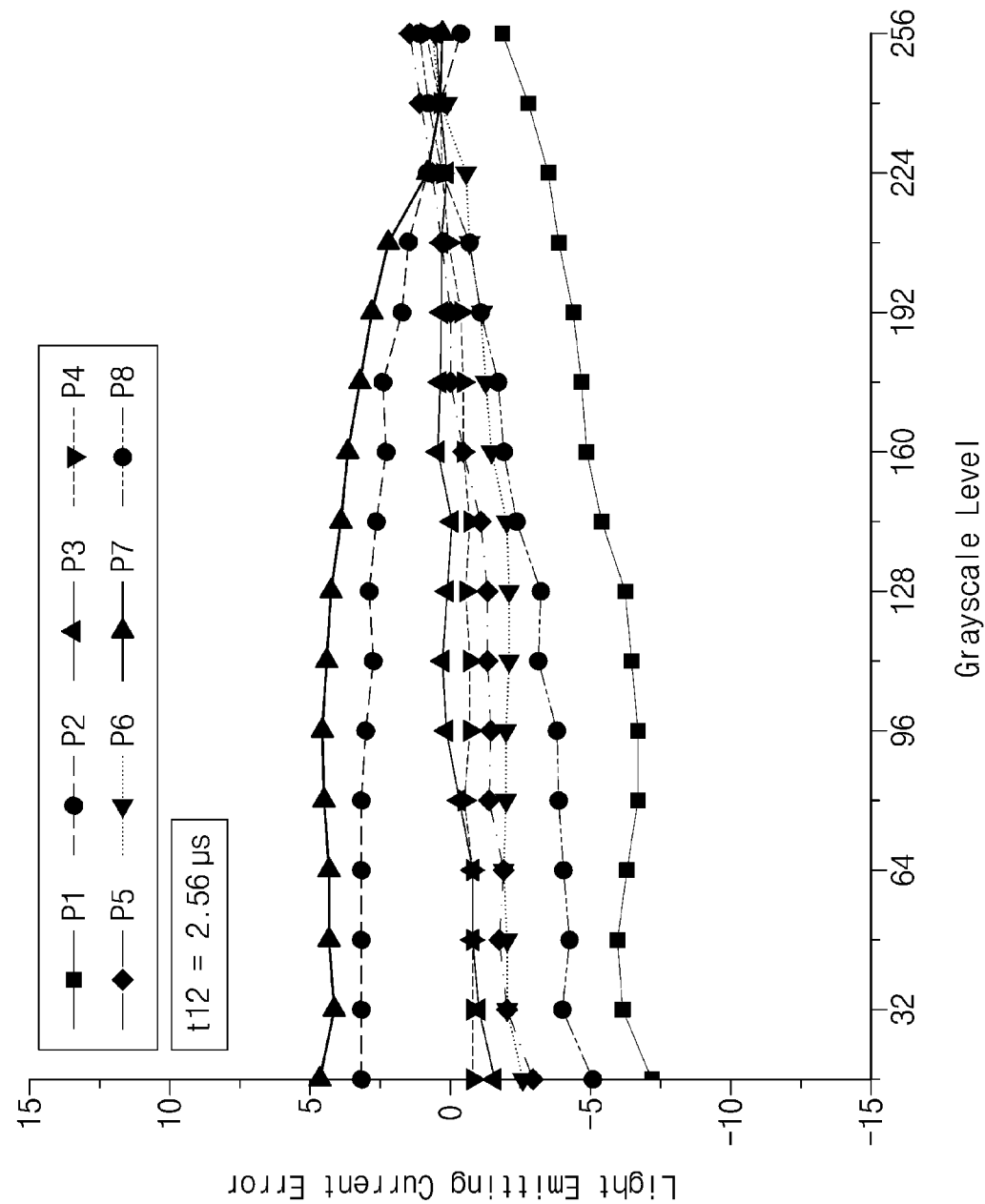

PIXEL AND A DISPLAY DEVICE INCLUDING THE SAME

CROSS-REFERENCE TO RELATED APPLICATION

This application claims priority under 35 U.S.C. § 119 to Korean Patent Application No. 10-2021-0084245 filed on Jun. 28, 2021, in the Korean Intellectual Property Office, the disclosure of which is incorporated by reference herein in its entirety.

TECHNICAL FIELD

Embodiments of the present disclosure described herein relate to a pixel and a display device including the same.

DISCUSSION OF RELATED ART

A display device is an output device for presentation of information in visual form. An organic light emitting display device displays an image by using an organic light emitting diode that generates light by the recombination of electrons and holes. The organic light emitting display device has fast response speed and low power consumption.

The organic light emitting display device includes pixels connected to data lines and scan lines. As an example, the pixels include an organic light emitting diode and a circuit part that controls the amount of current flowing into the organic light emitting diode. The organic light emitting diode generates light of a luminance corresponding to the amount of current delivered from the circuit part. In some cases, however, there may be a deviation in the current supplied to the organic light emitting diode.

SUMMARY

Embodiments of the present disclosure provide a pixel and a display device capable of operating at various driving frequencies.

According to an embodiment of the present disclosure, a pixel includes: a light emitting diode including an anode and a cathode; a first capacitor connected between a first node and a second node; a second capacitor connected between the second node and a third node; a first transistor including a first electrode connected to the second node, a second electrode electrically connected to the anode of the light emitting diode, and a gate electrode connected to the first node; a second transistor including a first electrode connected to the third node, a second electrode connected to a reference voltage line through which a reference voltage is provided, and a gate electrode connected to a first scan line through which a first scan signal is provided; a third transistor including a first electrode electrically connected to the first node, a second electrode connected to the reference voltage line, and a gate electrode connected to a second scan line through which a second scan signal is provided; and a fourth transistor including a first electrode connected to a data line, a second electrode connected to the third node, and a gate electrode connected to a third scan line through which a third scan signal is provided.

The first scan signal may be at an active level during a first period, each of the first scan signal and the second scan signal may be at the active level during a second period after the first period, and each of the second scan signal and the third scan signal may be at the active level during a third period after the second period.

The second period may be longer than the third period.

During the second period, a voltage level of each of the first node and the third node may correspond to the reference voltage, and a voltage level of the second node may be a voltage level corresponding to a sum of the reference voltage and a threshold voltage of the first transistor.

During the third period, the voltage level of the third node may correspond to a data voltage received through the data line, and the voltage level of the second node may correspond to a voltage of the first node, a voltage of the third node, the threshold voltage of the first transistor, and coupling capacitance between the first capacitor and the second capacitor.

The pixel may further include: a fifth transistor including a first electrode connected to a first voltage line, a second electrode connected to the second node, and a gate electrode connected to a light emitting control line through which a light emitting control signal is provided; and a sixth transistor including a first electrode connected to the second electrode of the first transistor, a second electrode connected to the anode of the light emitting diode, and a gate electrode connected to the light emitting control line.

The light emitting control signal may be at the active level during a fourth period after the third period.

One frame may include an active period and a blank period, and the active period may include the first period, the second period, the third period, and the fourth period.

The blank period may include a fifth period and a sixth period, each of the first scan signal and the light emitting control signal may be at the active level during the fifth period, and the light emitting control signal may be at an inactive level during the sixth period.

The light emitting control signal may maintain the active level during the blank period.

The pixel may further include: a seventh transistor including a first electrode connected to the first voltage line, a second electrode connected to the first node, and a gate electrode connected to the first voltage line.

The pixel may further include: an eighth transistor including a first electrode connected to the second electrode of the first transistor, a second electrode connected to the reference voltage line, and a gate electrode connected to the first scan line.

According to an embodiment of the present disclosure, a pixel includes: a light emitting diode including an anode and a cathode; a first capacitor connected between a first node and a second node; a second capacitor connected between the second node and a third node; a first transistor including a first electrode connected to the second node, a second electrode electrically connected to the anode of the light emitting diode, and a gate electrode connected to the first node; a second transistor configured to provide a reference voltage to the third node during a first period; a third transistor configured to provide the reference voltage to the first node during a second period after the first period; and a fourth transistor configured to provide a data signal to the third node during a third period after the second period.

The second period may be longer than the third period.

A gate electrode of the second transistor may receive a first scan signal, a gate electrode of the third transistor may receive a second scan signal, and a gate electrode of the fourth transistor may receive a third scan signal.

The first scan signal may be at an active level during the first period, each of the first scan signal and the second scan signal may be at the active level during the second period, and each of the second scan signal and the third scan signal may be at the active level during the third period.

The pixel may further include: a fifth transistor connected between a first voltage line and the second node and including a gate electrode for receiving a light emitting control signal; and a sixth transistor connected between the first transistor and the anode of the light emitting diode and including a gate electrode for receiving the light emitting control signal.

The pixel may further include: a seventh transistor connected between the first voltage line and the first node and including a gate electrode connected to the first voltage line; and an eighth transistor including a first electrode connected to the second electrode of the first transistor, a second electrode connected to a reference voltage line for providing the reference voltage, and a gate electrode for receiving a first scan signal.

According to an embodiment of the present disclosure, a display device includes: a pixel connected to a first scan line, a second scan line, a third scan line, and a data line; a scan driving circuit configured to output a first scan signal, a second scan signal, and a third scan signal for driving the pixel to the first scan line, the second scan line, and the third scan line, respectively; a data driving circuit configured to output a data signal to the data line; and a driving controller configured to control the scan driving circuit and the data driving circuit, wherein the pixel includes: a light emitting diode including an anode and a cathode; a first capacitor connected between a first node and a second node; a second capacitor connected between the second node and a third node; a first transistor including a first electrode connected to the second node, a second electrode electrically connected to the anode of the light emitting diode, and a gate electrode connected to the first node; a second transistor including a first electrode connected to the third node, a second electrode connected to a reference voltage line, and a gate electrode connected to the first scan line; a third transistor including a first electrode electrically connected to the first node, a second electrode connected to the reference voltage line, and a gate electrode connected to the second scan line; and a fourth transistor including a first electrode connected to the data line, a second electrode connected to the third node, and a gate electrode connected to the third scan line.

The first scan signal may be at an active level during a first period, each of the first scan signal and the second scan signal may be at the active level during a second period after the first period, each of the second scan signal and the third scan signal may be at the active level during a third period after the second period, and the second period may be longer than each of the first period and the third period.

According to an embodiment of the present disclosure, a pixel includes: a light emitting diode including an anode and a cathode; a first capacitor connected between a first node and a second node; a second capacitor connected between the second node and a third node; a first transistor including a first electrode connected to the second node, a second electrode electrically connected to the anode of the light emitting diode, and a gate electrode connected to the first node; a second transistor including a first electrode connected to the third node, a second electrode connected to a reference voltage line through which a reference voltage is provided, and a gate electrode connected to a first scan line through which a first scan signal is provided; a third transistor including a first electrode electrically connected to the first node, a second electrode connected to the reference voltage line, and a gate electrode connected to a second scan line through which a second scan signal is provided; and a fourth transistor including a first electrode connected to a data line, a second electrode connected to the third node, and a gate electrode connected to a third scan line through which a third scan signal is provided, wherein the first transistor and the second transistor are turned on during a first period of an active period.

The second transistor and the third transistor may be turned on and the fourth transistor may be turned off, during a second period of the active period.

The third transistor and the fourth transistor may be turned on and the second transistor may be turned off, during a third period of the active period.

The second, third and fourth transistors may be turned off, during a fourth period of the active period.

BRIEF DESCRIPTION OF THE FIGURES

The above and other features of the present disclosure will become apparent by describing in detail embodiments thereof with reference to the accompanying drawings.

FIGS. 3A, 3B, and 3C are timing diagrams for describing an operation of a display device, according to an embodiment of the present disclosure.

FIGS. 10A, 10B and 10C are diagrams illustrating light emitting current errors of each of pixels.

DETAILED DESCRIPTION OF THE EMBODIMENTS

Figure 1:
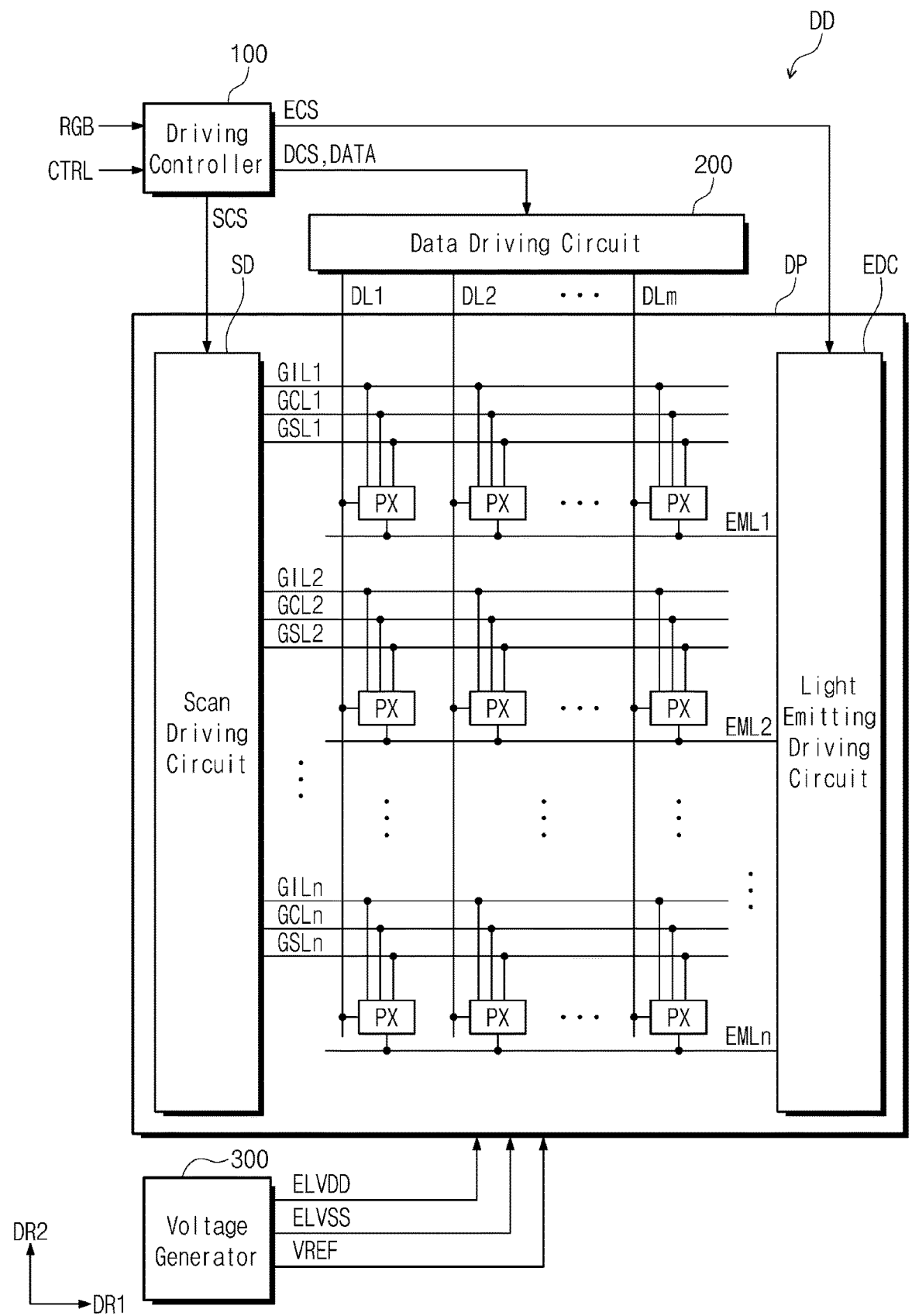
FIG. 1 is a block diagram of a display device, according to an embodiment of the present disclosure.

In the present specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals may refer to like components throughout the specification. In addition, in drawings, the thickness, ratio, and dimension of components may be exaggerated for an effective description of technical content. The term "and/or" includes any or all combinations of the one or more associated listed items.

The terms "first", "second", etc. may be used to describe various components, but the components are not limited by the terms. The terms are used to differentiate one component from another component. For example, a first component may be named as a second component, and vice versa. A singular form, unless otherwise stated, includes a plural form.

In addition, the terms "under", "beneath", "on", "above", etc. are used to describe a relationship between components illustrated in a drawing. The terms are relative and are described with reference to a direction indicated in the drawing.

It will be understood that the terms "include", "comprise", "have", etc. specify the presence of features, numbers, steps, operations, elements, components, or a combination thereof, described in the specification, but do not preclude the presence or additional possibility of one or more other features, numbers, steps, operations, elements, components or a combination thereof.

Unless otherwise defined, all terms (including technical terms and scientific terms) used in this specification have the same meaning as commonly understood by those skilled in the art to which the present disclosure belongs. Furthermore, terms such as terms defined in commonly used dictionaries should be interpreted as having a meaning consistent with the meaning in the context of the related technology, and should not be interpreted in an overly ideal or overly formal sense unless explicitly defined herein.

Hereinafter, embodiments of the present disclosure will be described with reference to accompanying drawings.

FIG. 1 is a block diagram of a display device, according to an embodiment of the present disclosure.

Referring to FIG. 1, a display device DD includes a display panel DP, a driving controller 100, a data driving circuit 200, and a voltage generator 300.

The driving controller 100 receives an image signal RGB and a control signal CTRL. The driving controller 100 generates an image data signal DATA by converting a data format of the image signal RGB to be suitable for the interface specification of the data driving circuit 200. The driving controller 100 outputs a scan control signal SCS, a data control signal DCS, and a light emitting driving control signal ECS.

The data driving circuit 200 receives the data control signal DCS and the image data signal DATA from the driving controller 100. The data driving circuit 200 converts the image data signal DATA into data signals and then outputs the data signals to a plurality of data lines DL1 to DLm to be described later. The data signals are analog voltages corresponding to grayscale values of the image data signal DATA.

The voltage generator 300 generates voltages to operate the display panel DP. In an embodiment of the present disclosure, the voltage generator 300 generates a first driving voltage ELVDD, a second driving voltage ELVSS, and a reference voltage VREF.

The display panel DP includes scan lines GIL1 to GILn, GCL1 to GCLn, and GSL1 to GSLn, light emitting control lines EML1 to EMLn, the data lines DL to DLm and a plurality of pixels PX. The display panel DP may further include a scan driving circuit SD and a light emitting driving circuit EDC. In an embodiment of the present disclosure, the scan driving circuit SD may be arranged on a first side of the display panel DP. The scan lines GIL1 to GILn, GCL1 to GCLn, and GSL1 to GSLn extend from the scan driving circuit SD in a first direction DR1.

The light emitting driving circuit EDC is arranged on a second side of the display panel DP. The light emitting control lines EML1 to EMLn extend from the light emitting driving circuit EDC in a direction opposite to the first direction DR1. However the present disclosure is not limited thereto, the scan driving circuit SD may be divided and one portion of the scan driving circuit SD may be provided on the second side of the display panel DP and another portion of the scan driving circuit SD may be provided on the first side of the display panel DP.

The scan lines GIL1 to GILn, GCL1 to GCLn, and GSL1 to GSLn and the light emitting control lines EML1 to EMLn are spaced from one another in a second direction DR2. The data lines DL1 to DLm extend from the data driving circuit 200 in a direction opposite to the second direction DR2, and are spaced from one another in the first direction DR.

In the example shown in FIG. 1, the scan driving circuit SD and the light emitting driving circuit EDC face each other with the plurality of pixels PX interposed therebetween, but the present disclosure is not limited thereto. For example, the scan driving circuit SD and the light emitting driving circuit EDC may be disposed adjacent to each other on one of the first side and the second side of the display panel DP. In an embodiment of the present disclosure, the scan driving circuit SD and the light emitting driving circuit EDC may be implemented with one circuit.

The plurality of pixels PX are electrically connected to the scan lines GIL1 to GILn, GCL1 to GCLn, and GSL1 to GSLn, the light emitting control lines EML1 to EMLn, and the data lines DL1 to DLm. Each of the plurality of pixels PX may be electrically connected to three scan lines and one light emitting control line. For example, as shown in FIG. 1, pixels PX in a first row may be connected to the scan lines GIL1, GCL1, and GSL1 and the light emitting control line EML1. In addition, pixels PX in a second row may be connected to the scan lines GIL2, GCL2, and GSL2 and the light emitting control line EML2. Further, pixels PX in an n-th row may be connected to the scan lines GILn, GCLn, and GSLn and the light emitting control line EMLn.

Each of the plurality of pixels PX includes a light emitting diode ED (refer to FIG. 2) and a pixel circuit for controlling light emission of the light emitting diode ED. The pixel circuit may include one or more transistors and one or more capacitors. The scan driving circuit SD and the light emitting driving circuit EDC may include transistors formed through the same process as transistors of the pixel circuit.

Each of the plurality of pixels PX receives the first driving voltage ELVDD, the second driving voltage ELVSS, and the reference voltage VREF from the voltage generator 300.

The scan driving circuit SD receives the scan control signal SCS from the driving controller 100. The scan driving circuit SD may respectively output scan signals GI1 to GIn, GC1 to GCn, and GS1 to GSn to the scan lines GIL1 to GILn, GCL1 to GCLn, and GSL1 to GSLn in response to the scan control signal SCS. In this specification, the scan lines GIL1 to GILn may be also referred to as first scan lines GIL1 to GILn, the scan lines GCL1 to GCLn may be also referred to as second scan lines GCL1 to GCLn, and the scan lines GSL1 to GSLn may be also referred to as third scan lines GSL1 to GSLn. Moreover, the scan signals GI1 to GIn may be also referred to as a first scan signal GI1 to GIn, the scan signals GC1 to GCn may be also referred to as a second scan signal GC1 to GCn, and the scan signals GS1 to GSn may be also referred to as a third scan signal GS1 to GSn.

The light emitting driving circuit EDC may output light emitting control signals EM1 to EMn to the light emitting control lines EML1 to EMLn in response to the light emitting driving control signal ECS from the driving controller 100.

The driving controller 100 according to an embodiment of the present disclosure may determine an operating frequency and may control the data driving circuit 200, the scan driving circuit SD, and the light emitting driving circuit EDC depending on the determined operating frequency.

Figure 2:
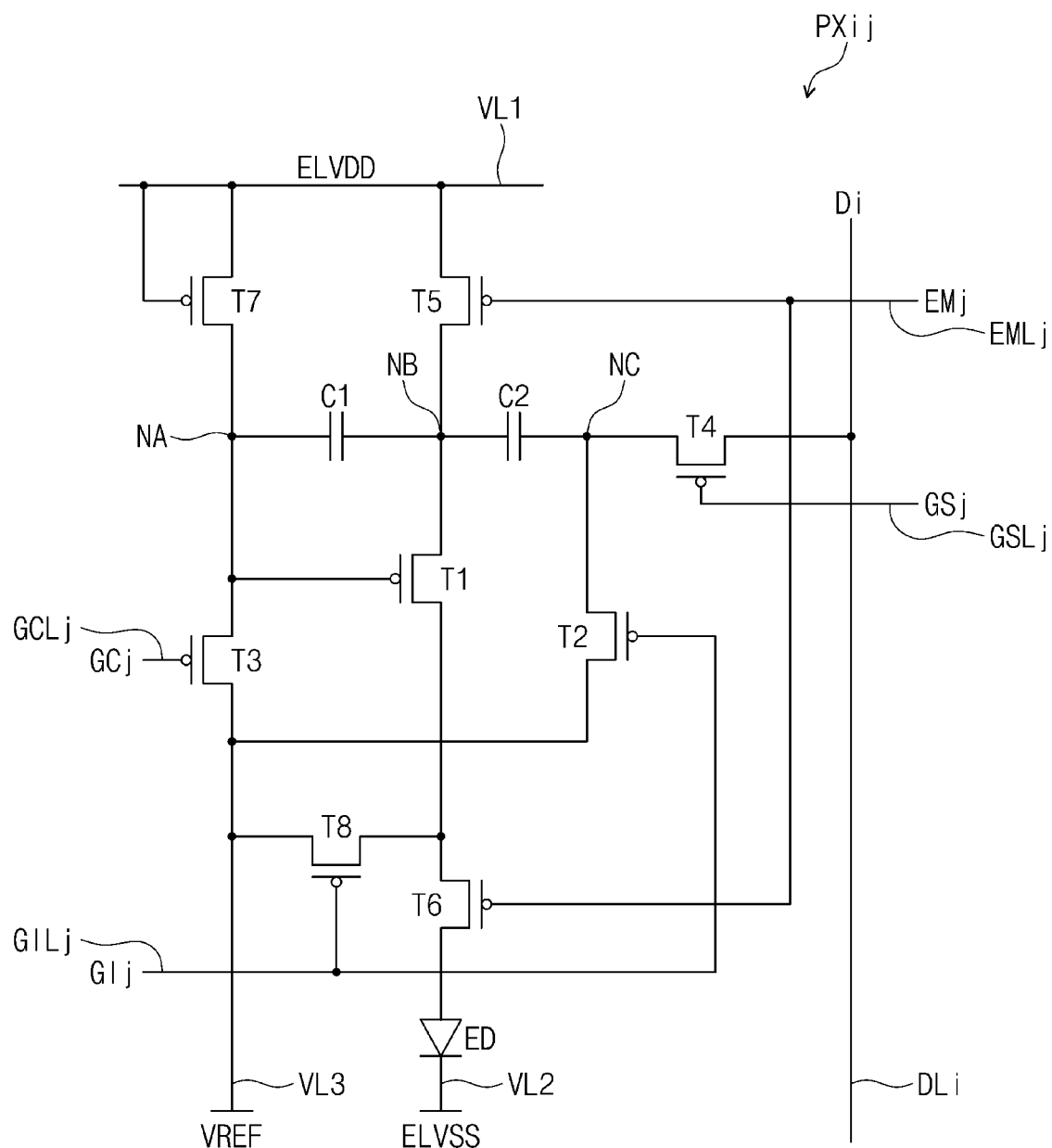
FIG. 2 is an equivalent circuit diagram of a pixel, according to an embodiment of the present disclosure.

FIG. 2 is an equivalent circuit diagram of a pixel, according to an embodiment of the present disclosure.

FIG. 2 illustrates an equivalent circuit diagram of a pixel PXij connected to an i-th data line DLi (may be also referred to as "a data line DLi" hereinafter) among the data lines DL1 to DLm, j-th scan lines GILj, GCLj, and GSLj (may be also referred to as "scan lines GILj, GCLj, and GSLj" or "a first scan line GILj", "a second scan line GCLj", and "a third scan line GSLj" hereinafter) among the scan lines GIL1 to GILn, GCL1 to GCLn, and GSL1 to GSLn, and a j-th light emitting control line EMLj (may be also referred to as "a light emitting control line EMLj" hereinafter) among the light emitting control lines EML1 to EMLn, which are illustrated in FIG. 1.

Each of the plurality of pixels PX shown in FIG. 1 may have the same circuit configuration as the equivalent circuit diagram of the pixel PXij shown in FIG. 2.

Referring to FIG. 2, the pixel PXij of a display device DD (refer to FIG. 1) according to an embodiment of the present disclosure includes first, second, third, fourth, fifth, sixth, seventh and eighth transistors T1, T2, T3, T4, T5, T6, T7, and T8, first and second capacitors C1 and C2, and at least one light emitting diode ED. In an embodiment of the present disclosure, it is described that the one pixel PXij includes one light emitting diode ED.

Each of the first to eighth transistors T1 to T8 is a P-type transistor having a low-temperature polycrystalline silicon (LTPS) semiconductor layer. In an embodiment of the present disclosure, all of the first to eighth transistors T1 to T8 may be N-type transistors. In an embodiment of the present disclosure, at least one of the first to eighth transistors T1 to T8 may be a P-type transistor and the remaining transistors may be N-type transistors.

Moreover, a circuit configuration of the pixel PXij is not limited to FIG. 2. The pixel PXij illustrated in FIG. 2 is merely an example, and the circuit configuration of the pixel PXij may be variously modified and implemented.

The scan lines GILj, GCLj, and GSLj may deliver scan signals GIj, GCj, and GSj, respectively. The light emitting control line EMLj may deliver a light emitting control signal EMj. The data line DLi delivers a data signal Di. The data signal Di may have a voltage level corresponding to the image signal RGB (refer to FIG. 1) input to the display device DD (refer to FIG. 1). First and second voltage lines VL1 and VL2 may deliver the first driving voltage ELVDD and the second driving voltage ELVSS to the pixel PXij, respectively. A reference voltage line VL3 may deliver the reference voltage VREF to the pixel PXij.

The first capacitor C1 is connected between a first node NA and a second node NB. The second capacitor C2 is connected between the second node NB and a third node NC. The first and second capacitors C1 and C2 are connected in series.

The first transistor T1 includes a first electrode electrically connected to the first voltage line VL1 via the fifth transistor T5, a second electrode electrically connected to an anode of the light emitting diode ED via the sixth transistor T6, and a gate electrode connected to the first node NA. The first electrode of the first transistor T1 may be a source electrode and the second electrode of the first transistor T1 may be a drain electrode, but the present disclosure is not limited thereto.

The second transistor T2 includes a first electrode connected to the third node NC, a second electrode connected to the reference voltage line VL3, and a gate electrode connected to the scan line GILj. The second transistor T2 is turned on in response to the scan signal GIj received through the scan line GILj to electrically connect the third node NC to the reference voltage line VL3.

The third transistor T3 includes a first electrode connected to the first node NA, a second electrode connected to the reference voltage line VL3, and a gate electrode connected to the scan line GCLj. The third transistor T3 is turned on in response to the scan signal GCj received through the scan line GCLj to electrically connect the first node NA to the reference voltage line VL3. The third transistor T3 is connected between the gate electrode of the first transistor T1 and the second electrode of the second transistor T2.

The fourth transistor T4 includes a first electrode connected to the data line DLi, a second electrode connected to the third node NC, and a gate electrode connected to the scan line GSLj. The fourth transistor T4 is turned on in response to the scan signal GSj received through the scan line GSLj to deliver the data signal Di received through the data line DLi to the third node NC. By virtue of its connection to the third node NC, the fourth transistor T4 is connected to the first electrode of each of the first and second transistors T1 and T2 (e.g., connected to the first electrode of the first transistor T1 via the second capacitor C2).

The fifth transistor T5 includes a first electrode connected to the first voltage line VL1, a second electrode connected to the second node NB, and a gate electrode connected to the light emitting control line EMLj. The fifth transistor T5 may be turned on by the light emitting control signal EMj received through the light emitting control line EMLj to deliver the first driving voltage ELVDD to the second node NB.

The sixth transistor T6 includes a first electrode connected to the second electrode of the first transistor T1, a second electrode connected to an anode of the light emitting diode ED, and a gate electrode connected to the light emitting control line EMLj. The sixth transistor T6 may be turned on by the light emitting control signal EMj received through the light emitting control line EMLj to electrically connect the second electrode of the first transistor T1 to the light emitting diode ED.

The seventh transistor T7 includes a first electrode connected to the first voltage line VL1, a second electrode connected to the first node NA, and a gate electrode connected to the first voltage line VL1. The seventh transistor T7 has a diode structure, in which the first electrode and the gate electrode thereof are connected to the first voltage line VL1, and may maintain a turned-off state while the first driving voltage ELVDD is supplied.

The eighth transistor T8 includes a first electrode connected to the anode of the light emitting diode ED via the sixth transistor T6, a second electrode connected to the reference voltage line VL3, and a gate electrode connected to the scan line GILj. The eighth transistor T8 is turned on by the scan signal GIj delivered through the scan line GILj to bypass a current of the anode of the light emitting diode ED to the reference voltage line VL3.

The light emitting diode ED includes the anode connected to the second electrode of the sixth transistor T6 and a cathode connected to the second voltage line VL2.

According to an embodiment of the present disclosure, the pixel PXij includes: a light emitting diode ED including an anode and a cathode; a first capacitor C1 connected between a first node NA and a second node NB; a second capacitor C2 connected between the second node NB and a third node NC; a first transistor T1 including a first electrode connected to the second node NB, a second electrode electrically connected to the anode of the light emitting diode ED, and a gate electrode connected to the first node NA; a second transistor T2 including a first electrode connected to the third node NC, a second electrode connected to a reference voltage line VL3 through which a reference voltage VREF is provided, and a gate electrode connected to a first scan line GILj through which a first scan signal GIj is provided; a third transistor T3 including a first electrode electrically connected to the first node NA, a second electrode connected to the reference voltage line VL3, and a gate electrode connected to a second scan line GCLj through which a second scan signal GCj is provided; and a fourth transistor T4 including a first electrode connected to a data line DLi, a second electrode connected to the third node NC, and a gate electrode connected to a third scan line GSLj through which a third scan signal GSj is provided.

Figure 3A:
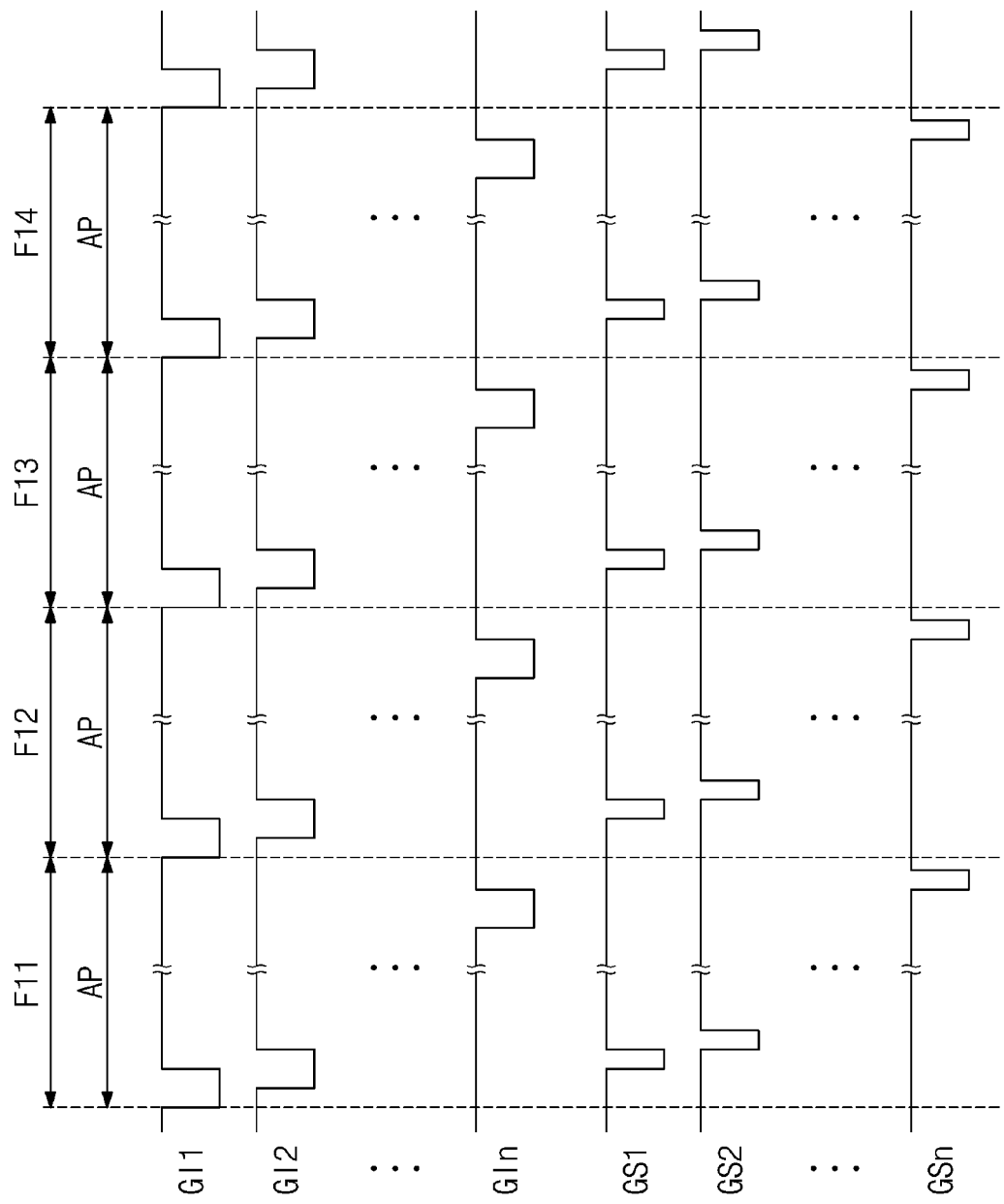
Figure 3C:
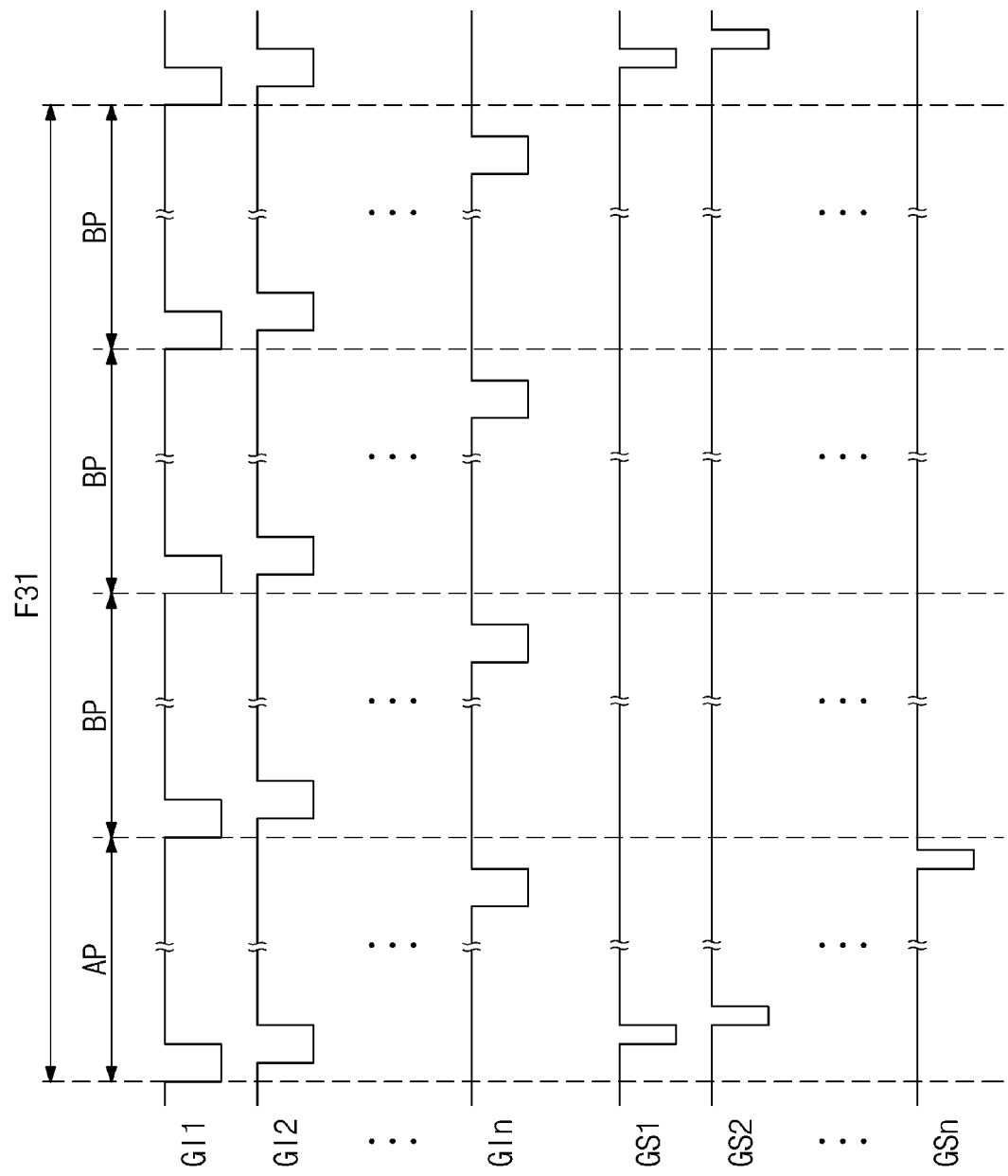

FIGS. 3A, 3B, and 3C are timing diagrams for describing an operation of a display device, according to an embodiment of the present disclosure.

Referring to FIGS. 1, 2, 3A, 3B, and 3C, for convenience of description, it is described that the display device DD operates at a first frequency (e.g., 240 Hz), a second frequency (e.g., 120 Hz), and a third frequency (e.g., 60 Hz). However, the present disclosure is not limited thereto. The operating frequency of the display device DD may be variously changed. In an embodiment of the present disclosure, the operating frequency of the display device DD may be selected as one of a first frequency, a second frequency, and a third frequency depending on the type of the image signal RGB. Further, the display device DD may not set the operating frequency to a specific frequency during an operation, but may change the operating frequency to one of the first to third frequencies at any time.

The driving controller 100 provides the scan control signal SCS to the scan driving circuit SD. The scan control signal SCS may include information about the operating frequency of the display device DD. The scan driving circuit SD may output the scan signals GC1 to GCn, GI1 to GIn, and GS1 to GSn corresponding to operating frequencies in response to the scan control signal SCS.

FIG. 3A is a timing diagram of scan signals when an operating frequency of the display device DD is a first frequency (e.g., 240 Hz).

Referring to FIGS. 1 and 3A, when the operating frequency is the first frequency (e.g., 240 Hz), during each of frames F11, F12, F13, and F14, the scan driving circuit SD sequentially activates the scan signals GI1 to GIn to a low level and sequentially activates scan signals GS1 to GSn to a low level. Only the scan signals GI1 to GIn and the scan signals GS1 to GSn are shown in FIG. 3A. However, the scan signals GC1 to GCn and the light emitting control signals EM1 to EMn may also be sequentially activated during each of the frames F11, F12, F13, and F14. Each of the frames F11, F12, F13, and F14 may include one active period AP. Further, in FIG. 3A, the scan signals GI1 to GIn remain low level for a longer period of time than the scan signals GS1 to GSn.

FIG. 3B is a timing diagram of scan signals when an operating frequency of the display device DD is a second frequency (e.g., 120 Hz).

Referring to FIGS. 1 and 3B, when the operating frequency is the second frequency (e.g., 120 Hz), the duration of each of frames F21 and F22 may be twice the duration of each of the frames F11, F12, F13, and F14 shown in FIG. 3A. Each of the frames F21 and F22 may include one active period AP and one blank period BP. During the active period AP, the scan driving circuit SD activates the scan signals GI1 to GIn, the scan signals GC1 to GCn, the scan signals GS1 to GSn, and the light emitting control signals EM1 to EMn to an active level (e.g., a low level) in a preset order.

FIG. 3B illustrates only the scan signals GI1 to GIn and the scan signals GS1 to GSn. However, the scan signals GC1 to GCn and the light emitting control signals EM1 to EMn may also be sequentially activated to the active level during the active period AP.

During the blank period BP, the scan driving circuit SD sequentially activates the scan signals GI1 to GIn to an active level and maintains the scan signals GS1 to GSn at an inactive level (e.g., a high level). The blank period BP may be referred to as a "self-scan period".

Also during the blank period BP of FIG. 3B, the scan driving circuit SD may maintain the scan signals GC1 to GCn at an inactive level (e.g., a high level) and may activate the light emitting control signals EM1 to EMn to the active level (e.g., a low level) in a preset order.

In the example shown in FIG. 3A described above, each of the frames F11, F12, F13, and F14 may correspond to an active period AP shown in FIG. 3B.

FIG. 3C is a timing diagram of scan signals when an operating frequency of the display device DD is a third frequency (e.g., 60 Hz).

Referring to FIGS. 1 and 3C, when the operating frequency is the third frequency (e.g., 60 Hz), the duration of a frame F31 may be twice the duration of each of the frames F21 and F22 shown in FIG. 3B. The duration of the frame F31 may be four times the duration of each of the frames F11, F12, F13, and F14 shown in FIG. 3A.

The frame F31 may include one active period AP and three blank periods BP. During the active period AP, the scan driving circuit SD activates the scan signals GI1 to GIn, the scan signals GC1 to GCn, the scan signals GS1 to GSn, and the light emitting control signals EM1 to EMn in a preset order.

FIG. 3C illustrates only the scan signals GI1 to GIn and the scan signals GS1 to GSn. However, the scan signals GC1 to GCn and the light emitting control signals EM1 to EMn may also be sequentially activated during the active period AP.

During each of the three blank periods BP, the scan driving circuit SD sequentially activates the scan signals GI1 to GIn to an active level and maintains the scan signals GS1 to GSn at an inactive level (e.g., a high level).

Also during the blank period BP of FIG. 3C, the scan driving circuit SD may maintain the scan signals GC1 to GCn at an inactive level (e.g., a high level) and may activate the light emitting control signals EM1 to EMn to the active level (e.g., a low level) in a preset order.

FIGS. 4A, 4B, 5A, 5B, 6A, 6B, 7A, and 7B are diagrams for describing an operation of the pixel illustrated in FIG. 2, according to an embodiment of the present disclosure.

FIGS. 4A, 4B, 5A, 5B, 6A, 6B, 7A and 7B illustrate and describe an operation of the pixel PXij illustrated in FIG. 2 during the frame F21 shown in FIG. 3B, but the present disclosure is not limited thereto.

In FIGS. 4B, 5B, 6B, and 7B, the one frame F21 includes the active period AP and the blank period BP. The active period AP includes a first period t11, a second period t12, a third period t13 and a fourth period t14. The blank period BP includes a fifth period t15, a sixth period t16 and a seventh period t17.

Figure 4A:
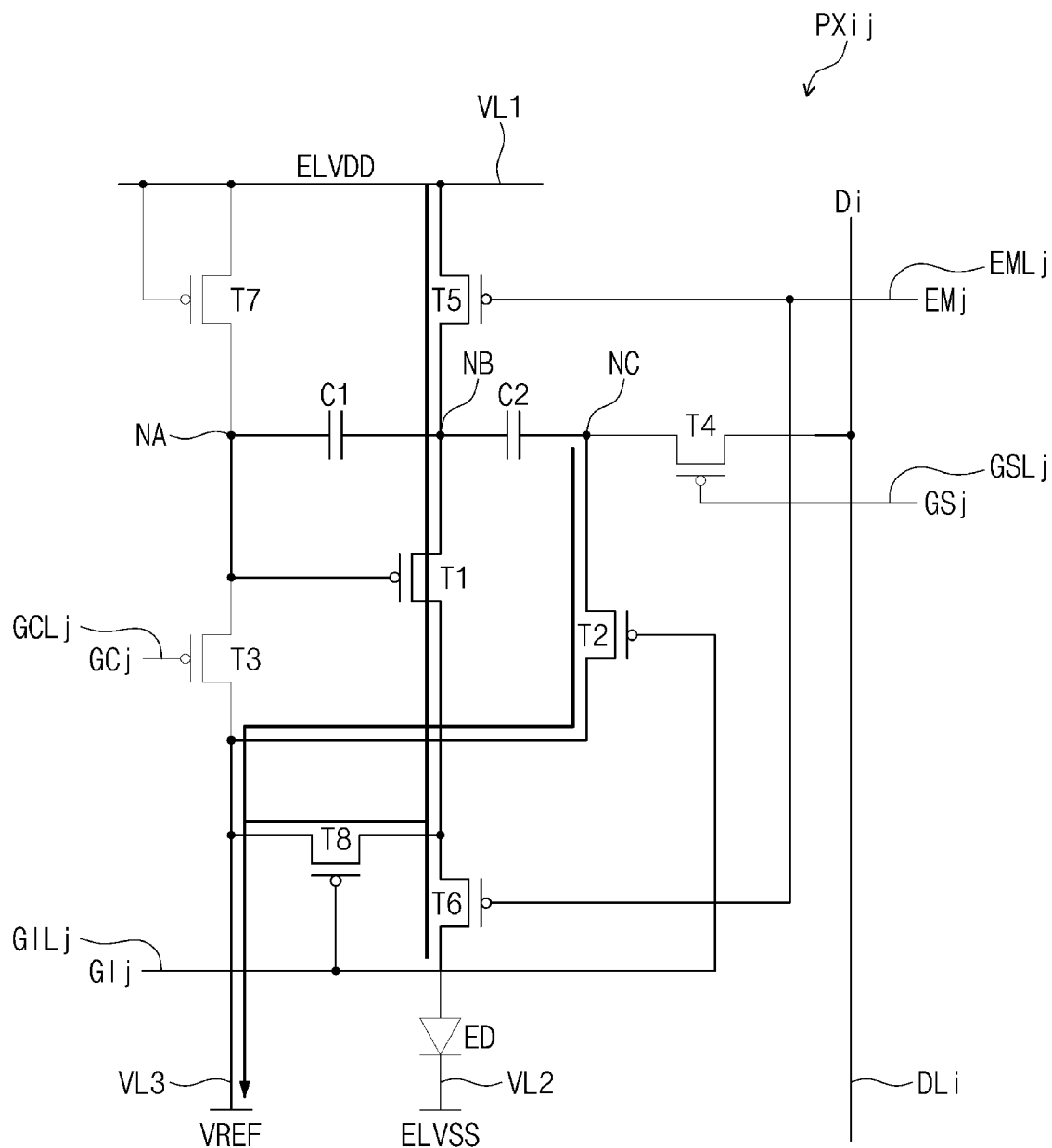
FIGS. 4A and 4B are diagrams for describing an operation of a pixel during a first period of an active period, according to an embodiment of the present disclosure.
Figure 4B:
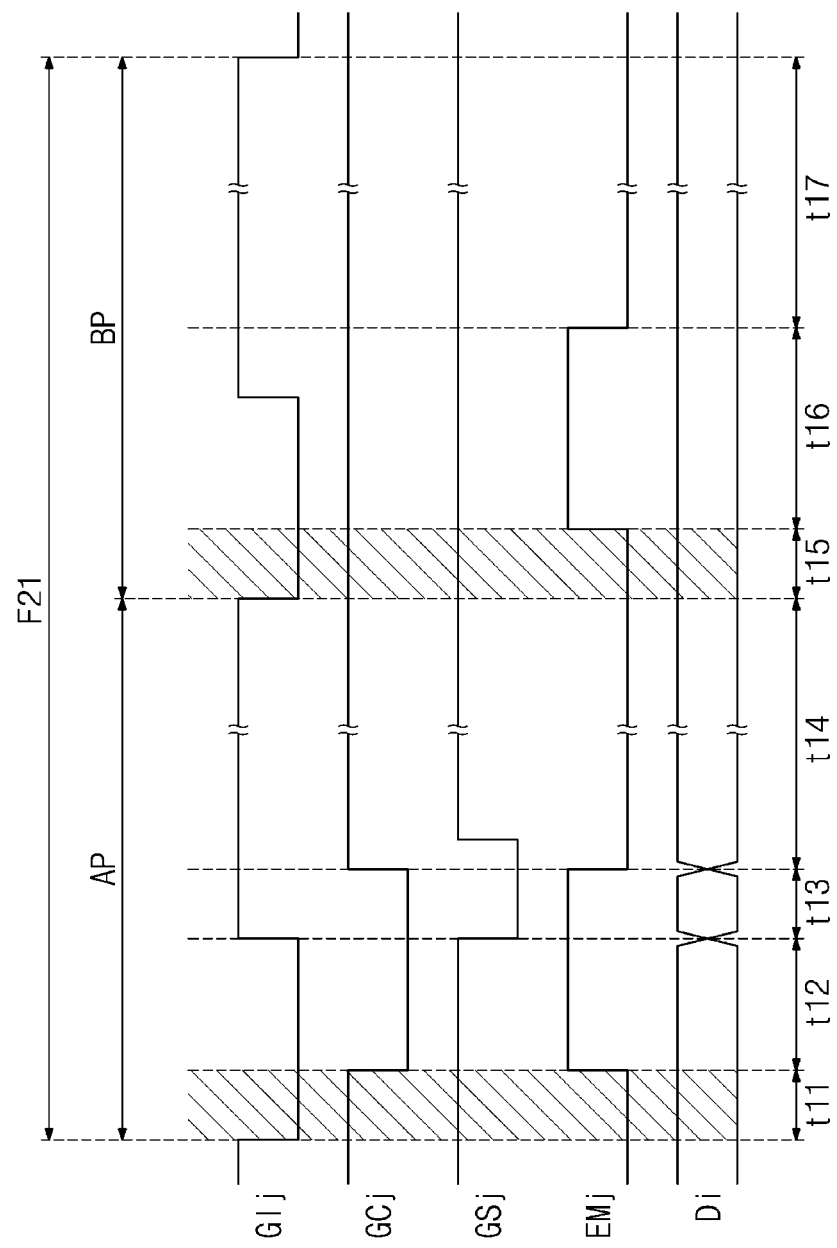

FIGS. 4A and 4B are diagrams for describing an operation of a pixel during the first period of the active period.

Referring to FIGS. 4A and 4B, when the scan signal GIj and the light emitting control signal EMj are at an active level (e.g., a low level) during the first period t11 of the active period AP, the second, fifth, sixth, and eighth transistors T2, T5, T6, and T8 are turned on. Because the first node NA is maintained by the first capacitor C1 at a voltage level corresponding to the data signal Di during a frame earlier than the current frame F21, the first transistor T1 maintains a turned-on state. Furthermore, when the scan signal GCj and the scan signal GSj are at an inactive level (e.g., a high level) during the first period t11, the third, fourth, and seventh transistors T3, T4, and T7 are turned off.

Accordingly, during the first period t11, a current path is formed between the first voltage line VL1 and the reference voltage line VL3 through the fifth transistor T5, the first transistor T1 and the eighth transistor T8. Moreover, during the first period t11, the third node NC may be initialized to the reference voltage VREF through the second transistor T2, and the anode of the light emitting diode ED may be initialized to the reference voltage VREF through the sixth transistor T6 and the eighth transistor T8.

The first period t11 may be an initialization period for initializing the third node NC and the anode of the light emitting diode ED.

Figure 5A:
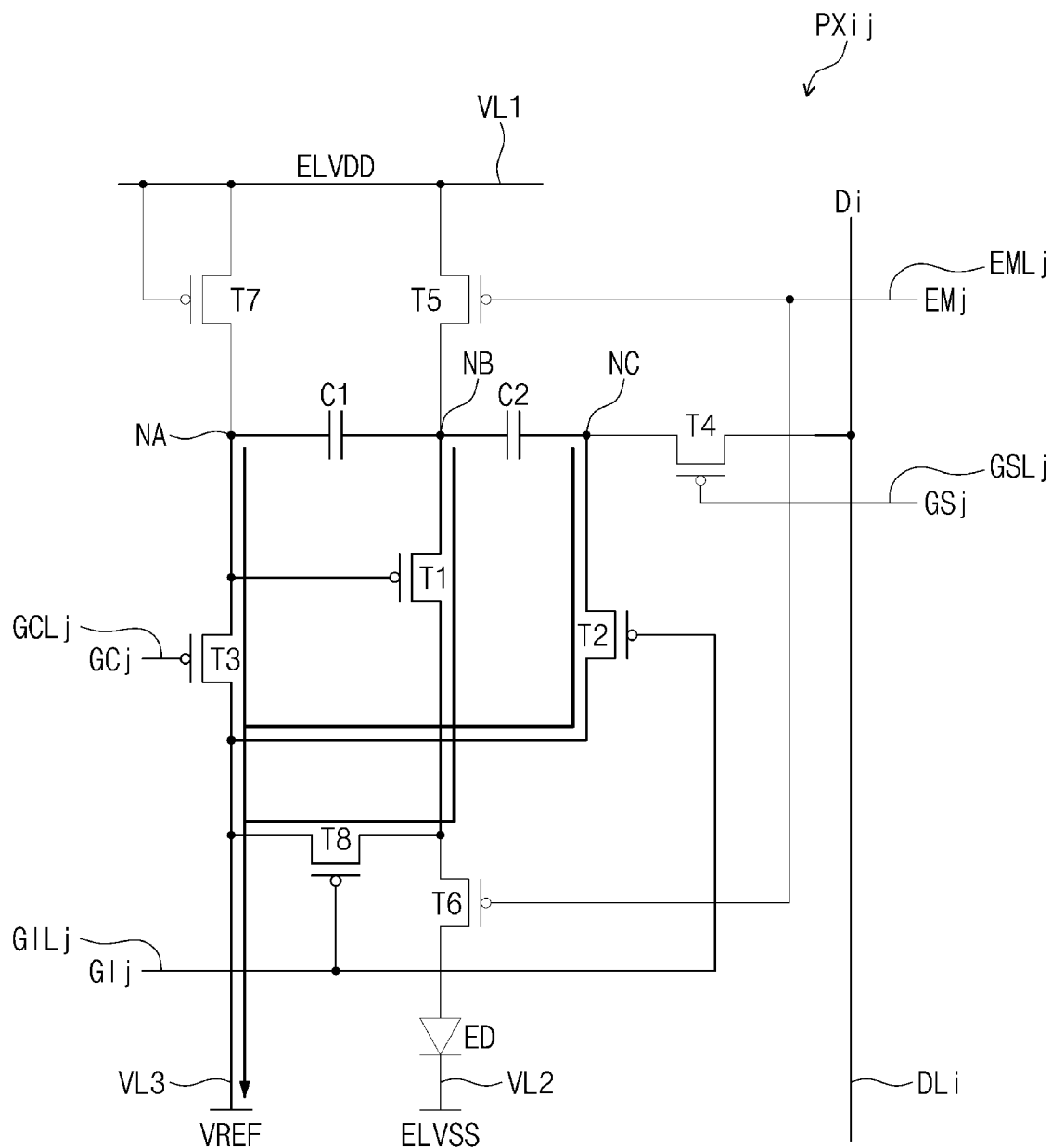
FIGS. 5A and 5B are diagrams for describing an operation of a pixel during a second period of an active period, according to an embodiment of the present disclosure.
Figure 5B:
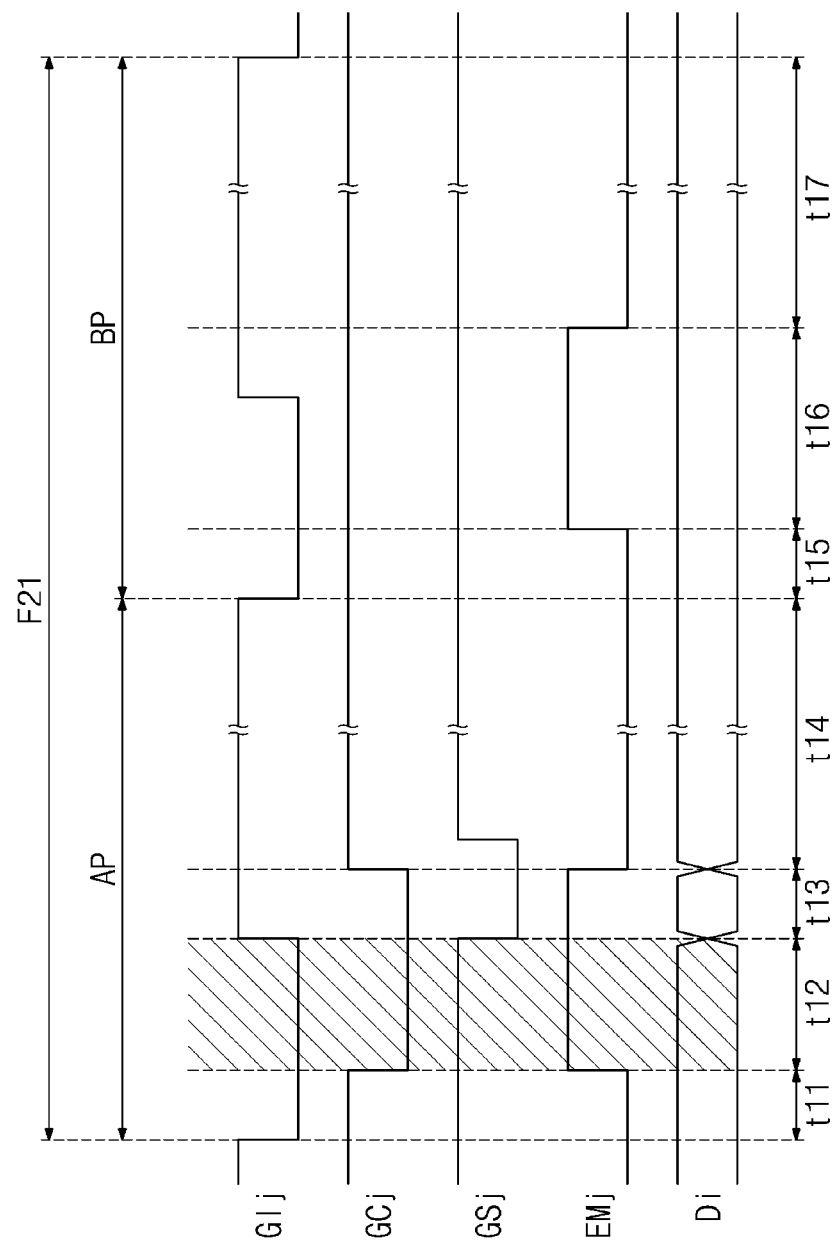

FIGS. 5A and 5B are diagrams for describing an operation of a pixel during the second period of the active period.

Referring to FIGS. 5A and 5B, when each of the scan signal GIj and the scan signal GCj is at an active level (e.g., a low level) during the second period t12, the second, third, and eighth transistors T2, T3, and T8 are turned on. In addition, when the scan signal GSj and the light emitting control signal EMj are at an inactive level (e.g., a high level) during the second period t12, the fourth, fifth, sixth, and seventh transistors T4, T5, T6, and T7 are turned off.

Accordingly, during the second period t12, the first node NA may be initialized to the reference voltage VREF through the third transistor T3, and the third node NC may be maintained at the reference voltage VREF through the second transistor T2 that is in a turned-on state. In addition, during the second period t12, the second node NB may be electrically connected to the reference voltage line VL3 through the first transistor T1 and the eighth transistor T8, and the voltage level of the second node NB may correspond to the sum of the reference voltage VREF and the threshold voltage of the first transistor T1. In the following description, the threshold voltage of the first transistor T1 is denoted as "Vth". In other words, the voltage level of the second node NB is "VREF+Vth".

The second period t12 may be a compensation period in which the voltage level of the second node NB is increased as much as the threshold voltage Vth of the first transistor T1 such that the threshold voltage Vth of the first transistor T1 is compensated.

Figure 6A:
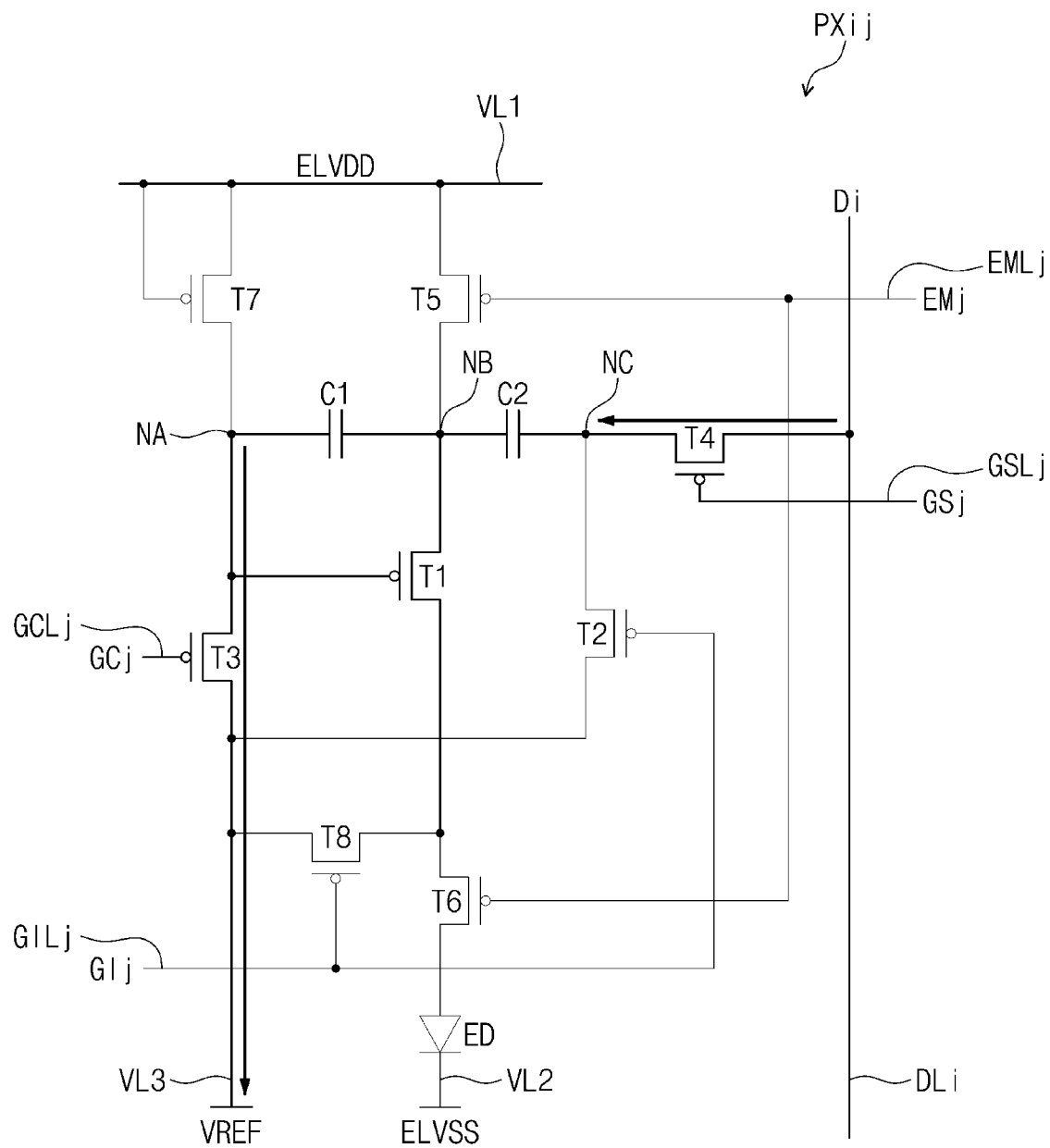
FIGS. 6A and 6B are diagrams for describing an operation of a pixel during a third period of an active period, according to an embodiment of the present disclosure.
Figure 6B:
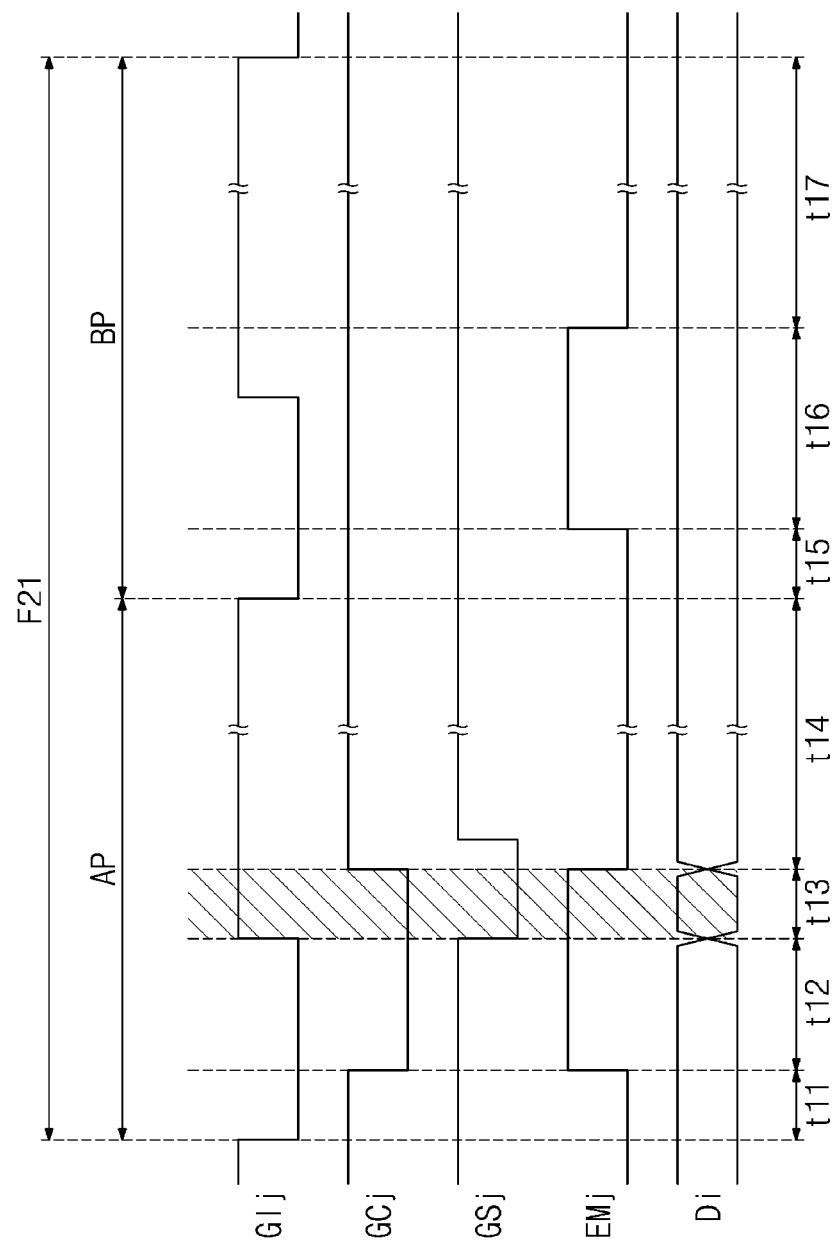

FIGS. 6A and 6B are diagrams for describing an operation of a pixel during the third period of the active period.

Referring to FIGS. 6A and 6B, when each of the scan signal GCj and the scan signal GSj are at an active level (e.g., a low level) during the third period t13, the third and fourth transistors T3 and T4 are turned on. Moreover, when the scan signal GIj and the light emitting control signal EMj are at an inactive level (e.g., a high level) during the third period t13, the second, fifth, sixth, seventh, and eighth transistors T2, T5, T6, T7, and T8 are turned off.

Accordingly, during the third period t13, the first node NA is maintained at the reference voltage VREF through the third transistor T3 that is in a turned-on state, and the data signal Di propagates to the third node NC through the fourth transistor T4.

In other words, during the third period t13, the voltage level of the first node NA may be the reference voltage VREF, and the voltage level of the third node NC may be a voltage level (denoted as "Vdata" in the following description) corresponding to the data signal Di.

In this case, a voltage level (denoted as "VB" in the following description) of the second node NB may be calculated by Equation below 1 by the coupling capacitances of the first and second capacitors C1 and C2.

$$VB = \frac{C1}{C1+C2} \times (VREF - Vdata) + Vth \qquad \text{[Equation 1]}$$

The third period t13 may be a programming period for providing the data signal Di to the third node NC. In an embodiment, the voltage level of the second node NB may correspond to a voltage of the first node NA, a voltage of the third node NC, the threshold voltage Vth of the first transistor T1, and coupling capacitance between the first capacitor C1 and the second capacitor C2.

Figure 7A:
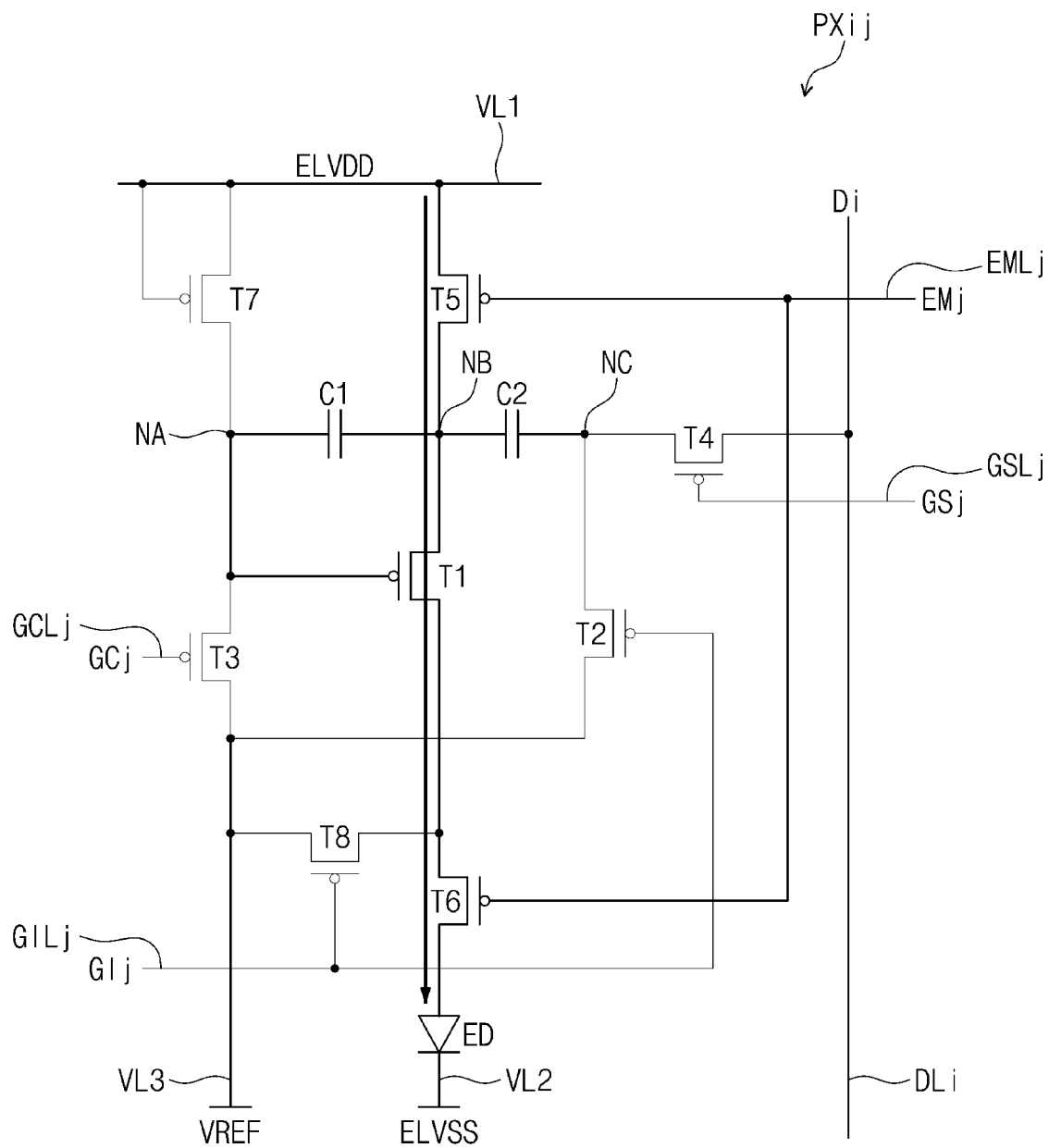
FIGS. 7A and 7B are diagrams for describing an operation of a pixel during a fourth period of an active period, according to an embodiment of the present disclosure.
Figure 7B:
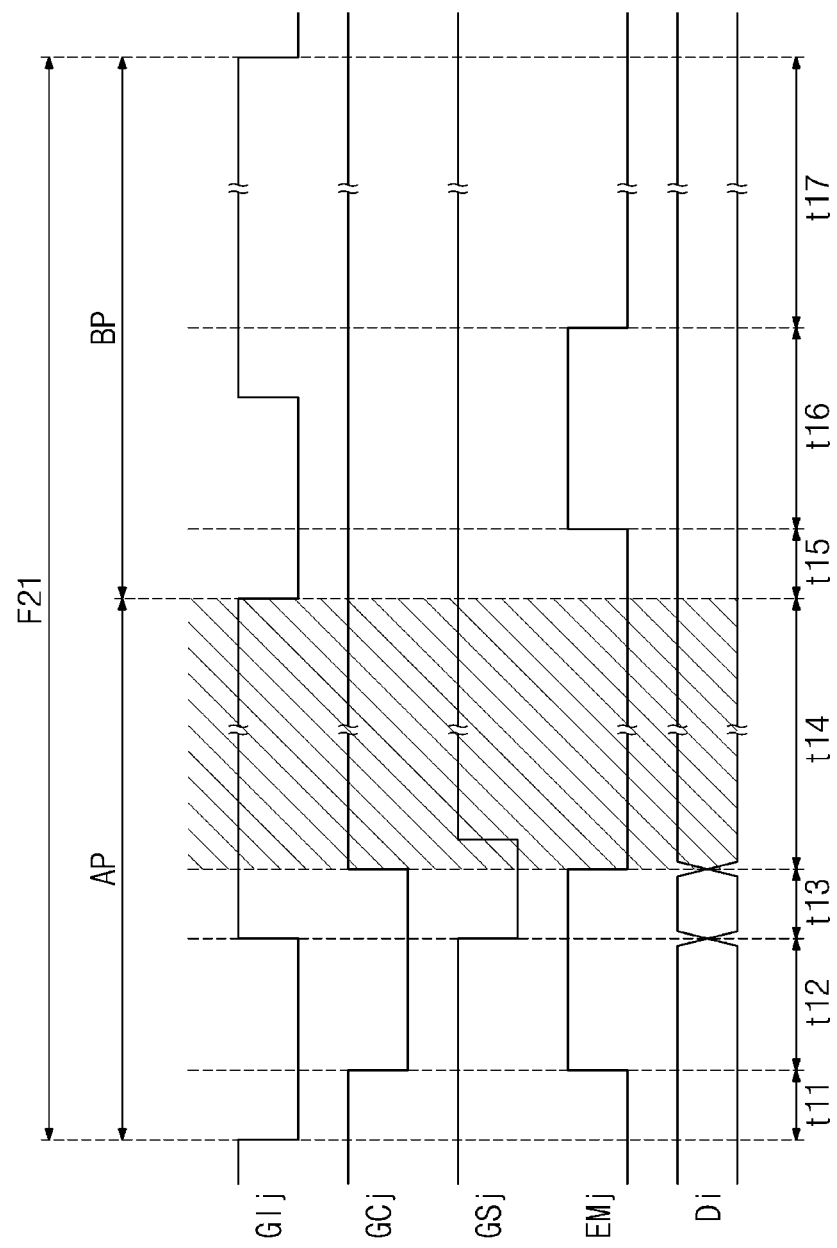

FIGS. 7A and 7B are diagrams for describing an operation of a pixel during the fourth period of the active period.

Referring to FIGS. 7A and 7B, all of the scan signals GIj, GCj, and GSj are at an inactive level (e.g., a high level) during the fourth period t14, and thus, the second, third, fourth, seventh, and eighth transistors T2, T3, T4, T7, and T8 are turned off. Furthermore, during the fourth period 14, the light emitting control signal EMj is transitioned to an active level (e.g., a low level), and the fifth and sixth transistors T5 and T6 are turned on.

Since the fifth transistor T5 is turned on, the first driving voltage ELVDD is supplied to the second node NB. Since the third transistor T3 is turned off, the voltage level of the first node NA may be changed by the voltage level of the second node NB.

The voltage level (denoted as "VA" in the following description) of the first node NA may be calculated by Equation 2 below.

$$VA = \frac{C1}{C1+C2}(VREF - Vdata) - Vth + ELVDD \qquad \text{[Equation 2]}$$

During the fourth period t14, a driving current flowing into the light emitting diode ED through the first transistor T1 may be controlled depending on the voltage level VA of the first node NA.

The fourth period t14 may be a light emitting period in which the light emitting diode ED emits light.

As can be seen from Equation 1, the driving current of the first transistor T1 depends on the threshold voltage Vth of the first transistor T1. The threshold voltage Vth of the first transistor T1 may be shifted due to the deterioration according to driving time. For example, because the degree of change (or deterioration) of the threshold voltage Vth of the first transistor T1 is different for each pixel, the shift degree of the threshold voltage Vth of the first transistor T1 is also different for each pixel.

As previously described in FIGS. 5A and 5B, the second period t12 is lengthened such that the voltage level of the second node NB can be increased as much as the threshold voltage Vth of the first transistor T1. In an embodiment of the present disclosure, the second period t12 is longer than the third period t13. In an embodiment, the second period t12 may be longer than each of the first period t11 and the third period t13. For example, regardless of the operating frequency, the threshold voltage Vth of the first transistor T1 may be sufficiently compensated by making the second period t12 sufficiently long.

In an embodiment of the present disclosure, the seventh transistor T7 is diode-connected between the first voltage line VL1 and the first node NA. While the first driving voltage ELVDD is supplied through the first voltage line VL1, the seventh transistor T7 maintains a turn-off state.

During the fourth period t14, a leakage current may be generated by the third transistor T3. When the operating frequency is high (e.g., 240 Hz or 120 Hz), a change in luminance of the light emitting diode ED due to the leakage current is not great. However, when the operating frequency is low (e.g., 60 Hz), the change in luminance of the light emitting diode ED due to the leakage current may be perceived by a user.

When the leakage current flows through the third transistor T3, the voltage level of the first node NA may be lowered. The voltage of the gate electrode of the first transistor T1 is changed when the voltage level of the first node NA is lowered. Accordingly, the driving current flowing into the light emitting diode ED through the first transistor T1 may be changed. A change in a driving current flowing into the light emitting diode ED changes the luminance of the light emitting diode ED, which the user may perceive as flicker.

The seventh transistor T7 is manufactured in the same process as the third transistor T3. Accordingly, when the leakage current flows through the third transistor T3, a leakage current may flow from the first voltage line VL1 to the first node NA through the seventh transistor T7. Moreover, because the leakage current of the third transistor T3 is almost identical to the leakage current of the seventh transistor T7, there is no change in the voltage of the gate electrode of the first transistor T1. Accordingly, because the change in the driving current flowing into the light emitting diode ED is very small, a user may not perceive a flicker.

Returning to FIGS. 4A and 4B, an operation of the pixel PXij during the fifth period t15 of the blank period BP is the same as an operation of the pixel PXij during the first period t11 of the active period AP. In other words, during the fifth period t15, the scan signal GIj and the light emitting control signal EMj are at an active level (e.g., a low level) and the scan signal GCj and the scan signal GSj are at an inactive level (e.g., a high level). In this case, a current path is formed between the first voltage line VL1 and the reference voltage line VL3 through the fifth transistor T5, the first transistor T1 and the eighth transistor T8. Moreover, during the fifth period t15, the third node NC may be initialized to the reference voltage VREF through the second transistor T2, and the anode of the light emitting diode ED may be initialized to the reference voltage VREF through the sixth transistor T6 and the eighth transistor T8.

During the sixth period t16, only the scan signal GIj is at an active level, and the scan signals GCj and GSj and the light emitting control signal EMj are at an inactive level.

During the seventh period t17, all the scan signals GIj, GCj, and GSj are at an inactive level, and the light emitting control signal EMj is at an active level. During the active period AP, the voltage level of the first node NA is maintained at a voltage level Vdata corresponding to the data signal Di and the voltage level VA (refer to Equation 2) set depending on the threshold voltage Vth of the first transistor T1. The first transistor T1 may provide a driving current corresponding to the voltage level of the first node NA to the light emitting diode ED through the sixth transistor T6. In other words, during the seventh period t17 of the blank period BP, the light emitting diode ED may display the same image as an image during the fourth period t14 of the active period AP.

Figure 8:
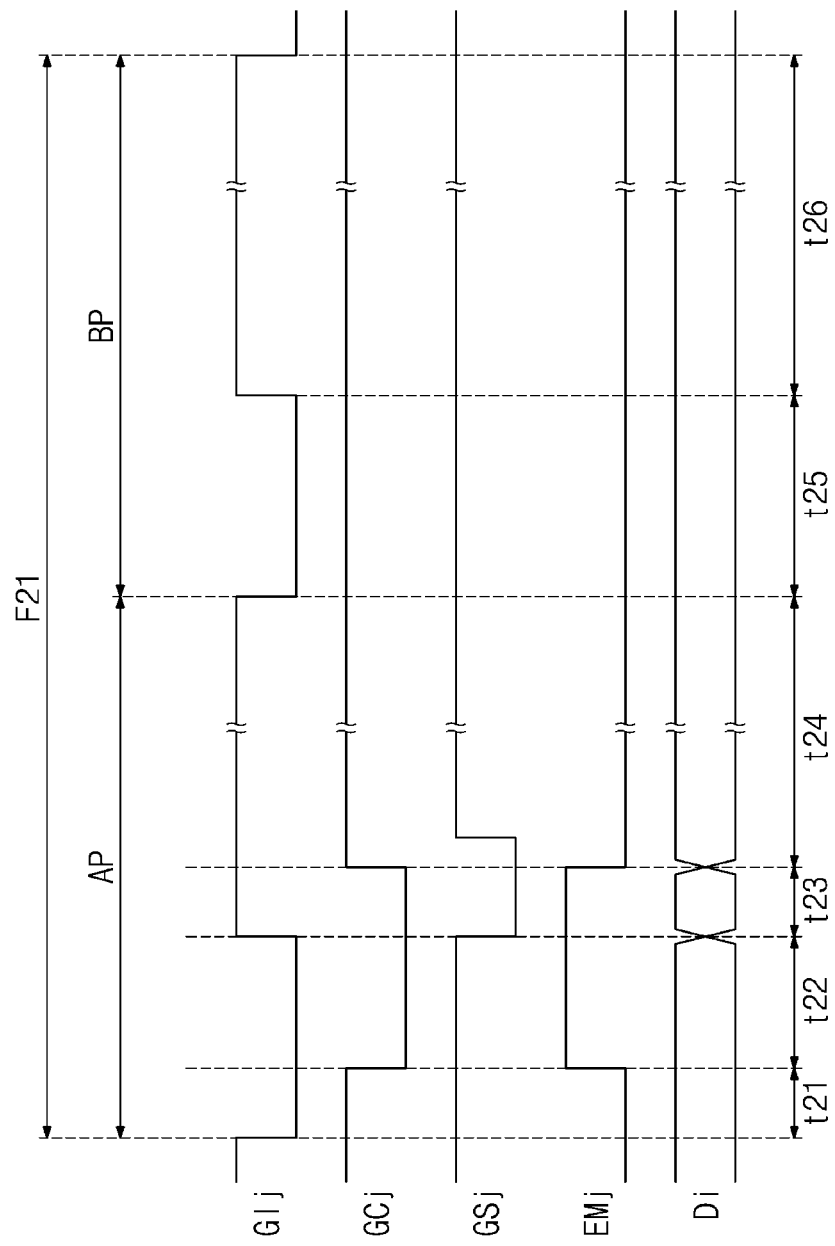
FIG. 8 is a timing diagram for describing an operation of a pixel, according to an embodiment of the present disclosure.

FIG. 8 is a timing diagram for describing an operation of a pixel, according to an embodiment of the present disclosure.

First, second, third and fourth periods t21, t22, t23 and t24 of the active period AP shown in FIG. 8 are respectively the same as the first to fourth periods t11 to t14 shown in FIGS. 4B, 5B, 6B, and 7B.

Referring to FIGS. 2 and 8, during a fifth period t25 of the blank period BP, each of the scan signal GIj and the light emitting control signal EMj is at an active level (e.g., a low level), and each of the scan signals GCj and GSj is at an inactive level (e.g., a high level). In other words, during the fifth period t25, a current path is formed between the first voltage line VL1 and the reference voltage line VL3 through the fifth transistor T5, the first transistor T1 and the eighth transistor T8. Moreover, during the fifth period t25, the third node NC may be initialized to the reference voltage VREF through the second transistor T2, and the anode of the light emitting diode ED may be initialized to the reference voltage VREF through the sixth transistor T6 and the eighth transistor T8.

During the sixth period t26, all the scan signals GIj, GCj, and GSj may be at inactive levels (e.g., a high level), and the light emitting control signal EMj may be maintained at an active level (e.g., a low level). During the active period AP, the voltage level of the first node NA is maintained at the voltage level Vdata corresponding to the data signal Di and the voltage level VA (refer to Equation 2) set depending on the threshold voltage Vth of the first transistor T1. The first transistor T1 may provide a driving current corresponding to the voltage level of the first node NA to the light emitting diode ED through the sixth transistor T6. In other words, during the sixth period t26 of the blank period BP, the light emitting diode ED may display the same image as an image during the fourth period t24 of the active period AP.

The light emitting control signal EMj shown in FIG. 8 is different from the light emitting control signal EMj shown in FIGS. 4B, 5B, 6B and 7B in that the light emitting control signal EMj shown in FIG. 8 is maintained at an active level (e.g., a low level) during the blank period BP.

Figure 9:
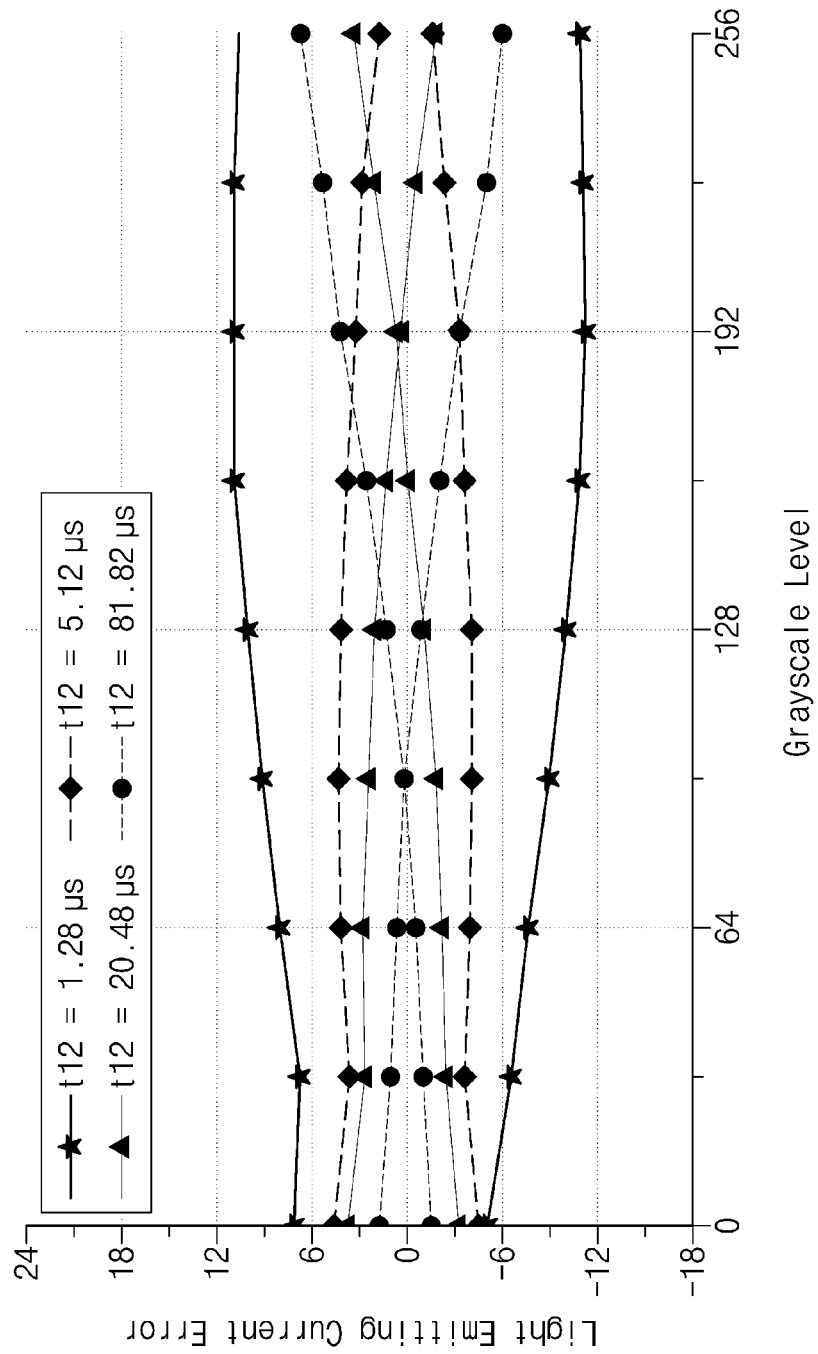
FIG. 9 is a graph illustrating a light emitting current error according to time of a second period shown in FIG. 5B.

FIG. 9 is a graph illustrating a light emitting current error according to time of the second period shown in FIG. 5B.

FIG. 9 illustrates a light emitting current error according to a grayscale level of the data signal Di (refer to FIG. 2) when the second period t12 is 1.28 microseconds (μs), 5.12 μs, 20.48 μs, or 81.82 μs. The light emitting current error is an error value obtained by comparing a current flowing into the light emitting diode ED shown in FIG. 2 with a predetermined reference current.

For example, when the second period t12 is 1.28 μs, a range of the light emitting current error at a grayscale level of 64 is from +8 to −8. When the second period t12 is 81.82 μs, the range of the light emitting current error at the grayscale level of 64 is from +1 to −1.

In other words, it can be seen that the range of the light emitting current error is smaller at a low grayscale level (e.g., the grayscale level of 64 or less) since the second period t12 is longer.

As shown in FIGS. 5A and 5B, during the second period t12, the reference voltage VREF is provided to the first node NA, and a voltage level "VREF+Vth" corresponding to the sum of the reference voltage VREF and the threshold voltage Vth of the first transistor T1 is provided to the second node NB. In this case, a sufficient time is required to store a charge in the first and second capacitors C1 and C2.

When a pulse width of the scan signal GSj shown in FIG. 5B is 1 horizontal period (referred to as "1H"), the pulse width of the scan signal GCj may be two horizontal periods 2H or more horizontal periods. It is possible to minimize the light emitting current error at a low grayscale level (e.g., the grayscale level of 64 or less) by making the second period t12 sufficiently long.

Figure 10B:
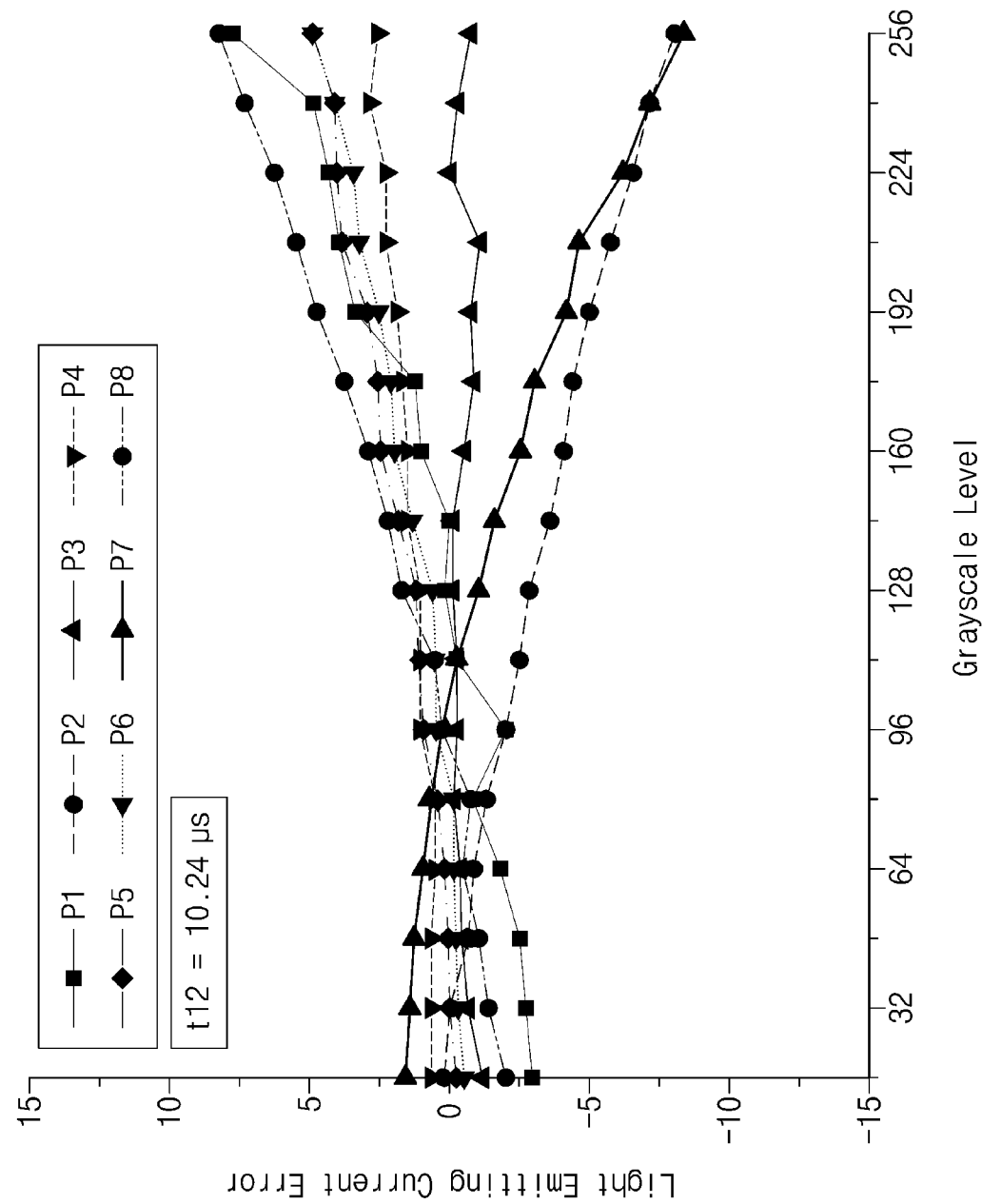
Figure 10C:
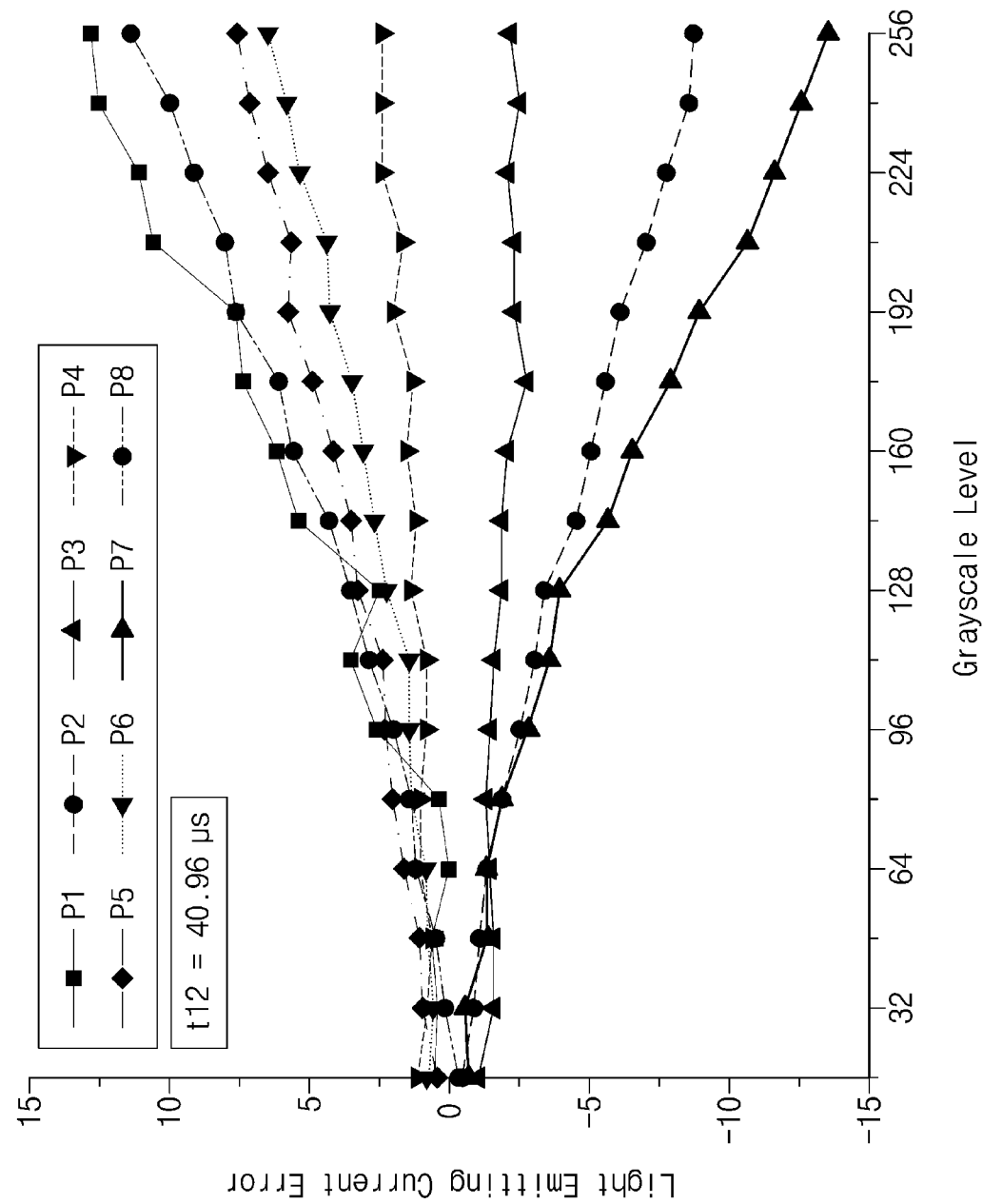

FIGS. 10A to 10C are diagrams illustrating light emitting current errors of each of pixels.

FIG. 10A is a diagram illustrating a light emitting current error of each of pixels P1, P2, P3, P4, P5, P6, P7 and P8 according to a grayscale level of the data signal Di (see FIG. 2) when the second period 12 is 2.56 μs.

FIG. 10B is a diagram illustrating a light emitting current error of each of the pixels P1, P2, P3, P4, P5, P6, P7 and P8 according to a grayscale level of the data signal Di (see FIG. 2) when the second period t12 is 10.24 μs.

FIG. 10C is a diagram illustrating a light emitting current error of each of the pixels P1, P2, P3, P4, P5, P6, P7 and P8 according to a grayscale level of the data signal Di (see FIG. 2) when the second period t12 is 40.96 μs.

Each of the pixels P1 to P8 may be pixels PX at any location of the display panel DP shown in FIG. 1.

As can be seen from FIGS. 10A to 10C, a current error between the pixels P1 to P8 decreases at a low grayscale level (e.g., a grayscale level of 64 or less) as the time of the second period t12 increases.

A display device having such a configuration may minimize a deviation in the current provided to a light emitting diode at a point in time when a low-grayscale image having a high operating frequency is displayed, by setting a compensation period for compensating for a threshold voltage of a driving transistor to be sufficiently long. Accordingly, it is possible to prevent a user from visually perceiving a luminance deviation when a low-grayscale image having a high driving frequency is displayed.

While the present disclosure has been described with reference to embodiments thereof, it will be apparent to those of ordinary skill in the art that various changes and modifications may be made thereto without departing from the spirit and scope of the present disclosure as set forth in the attached claims.

What is claimed is:

1. A pixel, comprising:
   a light emitting diode including an anode and a cathode;
   a first capacitor connected between a first node and a second node;
   a second capacitor connected between the second node and a third node;
   a first transistor including a first electrode connected to the second node, a second electrode electrically connected to the anode of the light emitting diode, and a gate electrode connected to the first node;
   a second transistor including a first electrode connected to the third node, a second electrode connected to a reference voltage line through which a reference voltage is provided, and a gate electrode connected to a first scan line through which a first scan signal is provided;
   a third transistor including a first electrode electrically connected to the first node, a second electrode connected to the reference voltage line, and a gate electrode connected to a second scan line through which a second scan signal is provided; and
   a fourth transistor including a first electrode connected to a data line, a second electrode connected to the third node, and a gate electrode connected to a third scan line through which a third scan signal is provided.

2. The pixel of claim 1, wherein the first scan signal is at an active level during a first period,
   wherein each of the first scan signal and the second scan signal is at the active level during a second period after the first period, and
   wherein each of the second scan signal and the third scan signal is at the active level during a third period after the second period.

3. The pixel of claim 2, wherein the second period is longer than the third period.

4. The pixel of claim 2, wherein, during the second period, a voltage level of each of the first node and the third node corresponds to the reference voltage, and a voltage level of the second node is a voltage level corresponding to a sum of the reference voltage and a threshold voltage of the first transistor.

5. The pixel of claim 4, wherein, during the third period, the voltage level of the third node corresponds to a data voltage received through the data line, and the voltage level of the second node corresponds to a voltage of the first node, a voltage of the third node, the threshold voltage of the first transistor, and coupling capacitance between the first capacitor and the second capacitor.

6. The pixel of claim 4, further comprising:
   a fifth transistor including a first electrode connected to a first voltage line, a second electrode connected to the second node, and a gate electrode connected to a light emitting control line through which a light emitting control signal is provided; and
   a sixth transistor including a first electrode connected to the second electrode of the first transistor, a second electrode connected to the anode of the light emitting diode, and a gate electrode connected to the light emitting control line.

7. The pixel of claim 6, wherein the light emitting control signal is at the active level during a fourth period after the third period.

8. The pixel of claim 7, wherein one frame includes an active period and a blank period, and
   wherein the active period includes the first period, the second period, the third period, and the fourth period.

9. The pixel of claim 8, wherein the blank period includes a fifth period and a sixth period,
   wherein each of the first scan signal and the light emitting control signal is at the active level during the fifth period, and
   wherein the light emitting control signal is at an inactive level during the sixth period.

10. The pixel of claim 8, wherein the light emitting control signal maintains the active level during the blank period.

11. The pixel of claim 6, further comprising:
    a seventh transistor including a first electrode connected to the first voltage line, a second electrode connected to the first node, and a gate electrode connected to the first voltage line.

12. The pixel of claim 1, further comprising:
    an eighth transistor including a first electrode connected to the second electrode of the first transistor, a second electrode connected to the reference voltage line, and a gate electrode connected to the first scan line.

13. A pixel, comprising:
    a light emitting diode including an anode and a cathode;
    a first capacitor connected between a first node and a second node;

a second capacitor connected between the second node and a third node;

a first transistor including a first electrode connected to the second node, a second electrode electrically connected to the anode of the light emitting diode, and a gate electrode connected to the first node;

a second transistor configured to provide a reference voltage to the third node during a first period;

a third transistor configured to provide the reference voltage to the first node during a second period after the first period; and a fourth transistor configured to provide a data signal to the third node during a third period after the second period.

14. The pixel of claim 13, wherein the second period is longer than the third period.

15. The pixel of claim 13, wherein a gate electrode of the second transistor receives a first scan signal, wherein a gate electrode of the third transistor receives a second scan signal, and wherein a gate electrode of the fourth transistor receives a third scan signal.

16. The pixel of claim 15, wherein the first scan signal is at an active level during the first period, wherein each of the first scan signal and the second scan signal is at the active level during the second period, and wherein each of the second scan signal and the third scan signal is at the active level during the third period.

17. The pixel of claim 13, further comprising:

a fifth transistor connected between a first voltage line and the second node and including a gate electrode for receiving a light emitting control signal; and a sixth transistor connected between the first transistor and the anode of the light emitting diode and including a gate electrode for receiving the light emitting control signal.

18. The pixel of claim 17, further comprising:

a seventh transistor connected between the first voltage line and the first node and including a gate electrode connected to the first voltage line; and an eighth transistor including a first electrode connected to the second electrode of the first transistor, a second electrode connected to a reference voltage line for providing the reference voltage, and a gate electrode for receiving a first scan signal.

19. A display device, comprising:

a pixel connected to a first scan line, a second scan line, a third scan line, and a data line;

a scan driving circuit configured to output a first scan signal, a second scan signal, and a third scan signal for driving the pixel to the first scan line, the second scan line, and the third scan line, respectively;

a data driving circuit configured to output a data signal to the data line; and a driving controller configured to control the scan driving circuit and the data driving circuit, wherein the pixel includes:

a light emitting diode including an anode and a cathode;

a first capacitor connected between a first node and a second node;

a second capacitor connected between the second node and a third node;

a first transistor including a first electrode connected to the second node, and a second electrode electrically connected to the anode of the light emitting diode, and a gate electrode connected to the first node;

a second transistor including a first electrode connected to the third node, a second electrode connected to a reference voltage line, and a gate electrode connected to the first scan line;

a third transistor including a first electrode electrically connected to the first node, a second electrode connected to the reference voltage line, and a gate electrode connected to the second scan line; and a fourth transistor including a first electrode connected to the data line, a second electrode connected to the third node, and a gate electrode connected to the third scan line.

20. The display device of claim 19, wherein the first scan signal is at an active level during a first period, wherein each of the first scan signal and the second scan signal is at the active level during a second period after the first period, wherein each of the second scan signal and the third scan signal is at the active level during a third period after the second period, and wherein the second period is longer than each of the first period and the third period.

21. A pixel, comprising:

a light emitting diode including an anode and a cathode;

a first capacitor connected between a first node and a second node;

a second capacitor connected between the second node and a third node;

a first transistor including a first electrode connected to the second node, a second electrode electrically connected to the anode of the light emitting diode, and a gate electrode connected to the first node;

a second transistor including a first electrode connected to the third node, a second electrode connected to a reference voltage line through which a reference voltage is provided, and a gate electrode connected to a first scan line through which a first scan signal is provided;

a third transistor including a first electrode electrically connected to the first node, a second electrode connected to the reference voltage line, and a gate electrode connected to a second scan line through which a second scan signal is provided; and a fourth transistor including a first electrode connected to a data line, a second electrode connected to the third node, and a gate electrode connected to a third scan line through which a third scan signal is provided, wherein the first transistor and the second transistor are turned on during a first period of an active period.

22. The pixel of claim 21, wherein the second transistor and the third transistor are turned on and the fourth transistor is turned off, during a second period of the active period.

23. The pixel of claim 22, wherein the third transistor and the fourth transistor are turned on and the second transistor is turned off, during a third period of the active period.

24. The pixel of claim 23, wherein the second, third and fourth transistors are turned off, during a fourth period of the active period.

* * * * *